US006789237B1

(12) United States Patent
Ismail

(10) Patent No.: US 6,789,237 B1
(45) Date of Patent: Sep. 7, 2004

(54) EFFICIENT MODEL ORDER REDUCTION VIA MULTI-POINT MOMENT MATCHING

(75) Inventor: Yehea I. Ismail, Evanston, IL (US)

(73) Assignee: Northwestern University, Evanston, IL (US)

( * ) Notice: Subject to any disclaimer, the term of this patent is extended or adjusted under 35 U.S.C. 154(b) by 156 days.

(21) Appl. No.: 10/142,276

(22) Filed: May 9, 2002

Related U.S. Application Data

(60) Provisional application No. 60/290,465, filed on May 11, 2001.

(51) Int. Cl.[7] .............................................. G06F 17/50
(52) U.S. Cl. ................................ 716/4; 716/3; 703/13; 703/14; 703/15
(58) Field of Search ............................... 716/1, 3, 4, 5; 703/13–15

(56) References Cited

U.S. PATENT DOCUMENTS

| | | | |
|---|---|---|---|
| 4,918,643 A | | 4/1990 | Wong |
| 5,047,971 A | | 9/1991 | Horwitz |
| 5,051,911 A | | 9/1991 | Kimura et al. |
| 5,313,398 A | | 5/1994 | Rohrer et al. |
| 5,379,231 A | | 1/1995 | Pillage et al. |
| 5,537,329 A | * | 7/1996 | Feldmann et al. ............. 716/4 |
| 5,689,685 A | | 11/1997 | Feldmann et al. |
| 6,023,573 A | | 2/2000 | Bai et al. |
| 6,041,170 A | | 3/2000 | Feldmann et al. |

OTHER PUBLICATIONS

Ismail, "Efficient Model Order Reduction via Multi–Node Moment Matching", IEEE, Nov. 10–14, 2002, pp. 767–774.*

Ismail, "Improved Model–Order Reduction by Using Spacial Information in Moments," IEEE, Oct. 2003, pp. 900–908.*

L. T. Pillage and R. A. Rohrer, "Delay Evaluation with Lumped Linear RLC Interconnect Circuit Models," *Proceedings of the Caltech Conference on VLSI*, pp. 143–158, May 1989.

L. T. Pillage and R. A. Rohrer, "Asymptotic Waveform Evaluation for Timing Analysis," IEEE Transactions on Computer–Aided Design, vol. 9, No. 4, Apr., 1990.

T. K. Tang and M. S. Nakhla, "Analysis of High–Speed VLSI Interconnects Using the Asymptotic Waveform Evaluation Techniques," *IEEE Transactions on Computer–Aided Design*, vol. CAD–11, No. 3, pp. 341–352, Mar. 1992.

(List continued on next page.)

*Primary Examiner*—Vuthe Siek
(74) *Attorney, Agent, or Firm*—Reinhart Boerner Van Deuren s.c.

(57) ABSTRACT

A method for mapping moments in a reduced order system of approximation order q for use in simulating a circuit or system having n state variables at n nodes, the circuit or system having I inputs. The method includes calculating only q+I moments, where q is the approximation order and I is the number of inputs of the circuit or system being simulated, sorting the state variables at the n nodes, selecting q nodes of the n nodes, and calculating the dominate poles and zeros using a multi-point moment matching algorithm to simultaneously match q+I moments at the selected q nodes of the circuit or system. In one embodiment, the method includes using extra dummy inputs such that the total number of inputs equals I, such that K*I>q where K is a constant having a value in the range of about 4 to 8.

12 Claims, 13 Drawing Sheets

OTHER PUBLICATIONS

C. L. Ratzlaff, N. Gopal, and L. T. Pillage, "RICE: Rapid Interconnect Circuit Evaluator," *Proceedings of the IEEE/ACM Design Automation Conference,* pp. 555–560, Jun. 1991.

R. Achar, M. S. Nakhla and Q. Zhang "Full–Wave Analysis of High–Speed VLSI Interconnects Using Complex Frequency Hopping," *IEEE Transactions on Computer–Aided Design,* vol. CAD–17, No. 10, pp. 997–1016, Oct. 1998.

A. Odabasioglu, M. Celik, and L. T. Pillage, "PRIMA: Passive Reduced–Order Interconnect Macromodeling Algorithm," *IEEE Transactions on Computer–Aided Design,* vol. CAD–17, No. 8, pp. 645–654, Aug. 1998.

P. Feldmann and R. W. Freund, "Reduced–Order Modeling of Large Passive Linear Circuits by Means of the SyPVL Algorithm," *Proceedings of the IEEE/ACM International Conference on Computer–Aided Design,* pp. 280–287, Nov. 1996.

E. Chiprout and M. Nakhla, "Generalized Moment–matching Methods for Transient Analysis of Interconnect Networks," 29th ACM/IEE Design Automation Conference, pp. 201–206, 1992.

R. W. Freund, "Krylov–Subspace Methods for Reduced–Order Modeling in Circuit Simulation," Numerical Analysis Manuscript No. 99–3–17, Bell Laboratories, Murray Hill, NJ, pp. 1–36, Nov. 1999.

R. Freud, "Reduced–Order Modeling Techniques Based on Krylov Subspaces and Their Use in Circuit Simulation,", Numerical Analysis Manuscrupt No. 98–3–02, Bell Laboratories, Murray Hill, NJ, Feb., 1998.

R. W. Freund, "Passive Reduced–Order Modeling Via Krylov–Subspace Methods," Numerical Analysis Manuscript No. 00–3–02, Bell Laboratories, Murray Hill, NJ, Mar., 2002.

* cited by examiner

US 6,789,237 B1

EFFICIENT MODEL ORDER REDUCTION VIA MULTI-POINT MOMENT MATCHING

CROSS-REFERENCE TO RELATED APPLICATION

This application claims priority of provisional application, serial No. 60/290,465, filed on May 11, 2001.

FIELD OF THE INVENTION

This invention relates to the design of microelectronic circuits and systems, and more particularly, to simulators for evaluating the performance of microelectronic circuits and systems prior to fabrication.

BACKGROUND OF THE INVENTION

In the process of designing circuits, particularly large scale integrated circuits, it is normal practice to mathematically model the electrical circuits. Many circuit simulators have been developed to mathematically model the circuits. Particularly, the outputs of the circuit are modeled as a function of the inputs to the circuit. The mathematical model is used to determine various response characteristics of the circuit.

Circuit simulation has long been an essential step in the design and manufacture of microelectronic circuits and systems. Circuit simulators are typically software based and are designed to accept a description of the circuit that defines the circuit topology and element values. Simulators typically simulate circuits which contain linear devices such as resistors capacitors and inductors, voltage and current sources and nonlinear devices such as diodes, bipolar junction transistors (BJT), junction field effect transistors (JFET) and metal oxide semiconductor field effect transistors (MOSFET). The simulator can typically be configured to perform DC analysis, AC small signal analysis and transient analysis.

The modeling of the larger overall circuit can be extremely complex in large scale integrated (LSI) circuits, very large scale integrated (VLSI) circuits, and ultra large scale integrated (ULSI) circuits. Simulation of extremely LSI, VLSI, and ULSI circuits require better simulators. As the size and complexity of circuits has grown, so has the need for simulators that are capable of testing larger and more complex circuits.

A traditional simulation tool, such as a dynamic simulator (SPICE, for example), can be used. However, because of the large number of circuit elements involved, a complete simulation becomes extremely time consuming and may exceed the storage capability of the processing system on which the simulation is run. Dynamic simulators such as SPICE-like simulators that are based on integration of nonlinear ordinary differential equations are useful in analyzing nonlinear circuit but are relatively inefficient for highly interconnected circuits or networks.

In recent years, moment matching techniques, e.g., [1]–[3], havegrown to be among the most popular linear circuit simulation techniques. The moments of a transfer function of order n results from expanding the transfer function into a Taylor series around s=0 as given by $$H(s) = \frac{1 + a_1 s + a_2 s^2 + \ldots + a_m s^m}{1 + b_1 s + b_2 s^2 + \ldots + b_n s^n} = 1 + m_1 s + m_2 s^2 + m_3 s^3 + \ldots ,\quad (1)$$

The $i^{th}$ moment of the transfer function $m_i$ is the coefficient of $s^i$ in the series expansion. To illustrate the relation between the moments, poles, and residues of the transfer function, (1) can be expressed as a partial fractions sum given by $$H(s) = \frac{k_1}{s - p_1} + \frac{k_2}{s - p_2} + \ldots + \frac{k_n}{s - p_n},\quad (2)$$

where $p_i$ is the $i^{th}$ pole of the transfer function and $k_i$ is the corresponding residue. By expanding each term in equation (2) into powers of s, the moments of H(s) can be expressed as $$m_0 = -\left(\frac{k_1}{p_1} + \frac{k_2}{p_2} + \ldots + \frac{k_n}{p_n}\right),$$

$$m_1 = -\left(\frac{k_1}{p_1^2} + \frac{k_2}{p_2^2} + \ldots + \frac{k_n}{p_n^2}\right),$$

$$\vdots$$

$$m_{2n-1} = -\left(\frac{k_1}{p_1^{2n}} + \frac{k_2}{p_2^{2n}} + \ldots + \frac{k_n}{p_n^{2n}}\right).\quad (3)$$

This favorable reciprocal relation between the moments and the poles stresses the dominant poles with smaller magnitudes. Dominant poles are of most interest when evaluating the transient response. This characteristic makes the moments very popular in circuit simulation. Moreover, the moments around s=0 can be calculated very easily for tree structured and tree like interconnect in linear time with the number of elements in the circuit [1]–[5]. Path tracking techniques for efficiently calculating the moments for tree and tree like structures where introduced in [4] and [5]. Note that tree like structures include capacitively and inductively coupled trees. Also, other techniques have been developed in [5] to extend the efficiency of path tracking techniques to circuits with few resistive and inductive loops. The overwhelming majority of interconnects in integrated circuits fall into these categories of circuits. The efficiency of calculating the moments around s=0 further increased the popularity of moment matching techniques.

Numerous moment matching techniques are known in the art for large linear circuit analysis. One technique in particular is the asymptotic Waveform Evaluation (AWE) algorithm. The AWE technique [2], [3] employs moment matching by calculating the first 2q moments of the transfer function around s=0 to determine the first q dominant poles and corresponding residues of the transfer function. The moments at node j are approximated by $$m_0^j = -\left(\frac{k_1^j}{p_1} + \frac{k_2^j}{p_2} + \ldots + \frac{k_q^j}{p_q}\right),$$

$$m_1^j = -\left(\frac{k_1^j}{p_1^2} + \frac{k_2^j}{p_2^2} + \ldots + \frac{k_q^j}{p_q^2}\right),$$

$$\vdots$$

$$m_{2q-1}^j = -\left(\frac{k_1^j}{p_1^{2q}} + \frac{k_2^j}{p_2^{2q}} + \ldots + \frac{k_q^j}{p_q^{2q}}\right).\quad (4)$$

where the terms representing poles with magnitude larger than $p_q$ are neglected and $p_1 < p_2 < \ldots < p_q$. Hence, the first q most dominant poles and corresponding residues can be calculated by solving the set of 2q nonlinear equations with 2q variables in equation (4). Indirect methods to solve equation (4) were also developed in [2].

The process by which the moments are determined does not allow calculating the moments at few selected nodes of a circuit and the moments have to be calculated at all nodes since the i+1 moment at any node j depends on the $i^{th}$ moments at all the nodes [1]–[5]. However, the AWE techniques only uses the moments at a single node at a time to calculate the response at that node and all the moments calculated at other nodes are not used. Hence, techniques of the prior art such as the AWE techniques are referred to as Single-point Moment Matching (SMM) techniques. These techniques improve the approximation accuracy by calculating more moments at each node.

As will be shown, accuracy can be also improved by using the information in the moments at different nodes simultaneously. However, multiple input circuits are becoming increasingly cammon in integrated circuits with the increasing importance a analyzing interconnects with capacitive and inductive coupling. Also, important structures such as the power distribution networks are typically multi-input circuits. A major problem with SMM techniques is the inherent numerical instability with higher order approximations. The set of equations (4) is very sensitive to numerical errors with high q due to the high powers of the poles involved. Even with a moderate disparity in the pole values, higher moments very quickly contain no information about larger magnitude poles due to truncation errors. For that reason SMM techniques are limited to less than eight to ten poles [4]–[6]. With complicated integrated circuits, increasing inductance effects, higher inductive and capacitive coupling, and higher operating frequencies, approximations with orders higher than can be achieved by single-point moment matching become necessary. The poles of a circuit effectively represent its harmonics. The more complex the harmonics, the greater the number of poles required for accurate simulation. For simple RC (resistive-capacitance) circuits, usually only a few dominant poles are required for high accuracy simulation. Under such conditions, the AWE approximation method is quite accurate and is widely used for simple RC circuits. But, for today's more complex RLC circuits (resistive-inductive-capacitance) multi-input circuits, the harmonics becomes complex and the number of poles required for accurately simulating the circuit becomes quite large. As a general rule, AWE breaks down when poles exceed eight in number.

To overcome this limitation of AWE, techniques such as Complex Frequency Hopping (CFH) have been proposed to determine higher number of poles [7]–[8]. When circuit harmonics is complex, an approximation method is needed that is more accurate than AWE. "Complex Frequency Hopping" (CFH) represents a more accurate method.

Mathematically speaking, Complex Frequency Hopping works by calculating poles around s=0, but then "hops" to calculate poles around "s" at some harmonic frequency greater than 0. The common poles calculated at both "hops" (s=0 and s=non-zero) are said to be "accurate," and the ones found only by one of the two hops are said to be "inaccurate."

The Complex Frequency Hopping method is more accurate than AWE, but it is also time consuming and therefore slow to implement. For certain applications, such as microwave circuit design, high speed is not required (presumably because there are less design iterations or the circuits have a fairly modest number of nodes), so the method can work quite nicely. Because the CFH technique calculates the moments around several frequency points instead of only around s=0, a different set of poles is emphasized around the selected frequency point in each set of moments, allowing the calculation of high number of poles. However, calculating the moments around s≠0 cannot use path tracking techniques and is much more complicated than calculating the moments around s=0, especially when inductive and capacitive coupling are present. Also, determining the set of points around which the moments are calculated is a nontrivial task.

Another set of techniques becoming increasingly if popular are based on Krylov sub-spaces and Lanczos process, e.g., [9]–[14]. These techniques implicitly match the moments of the circuit by using a different set of vectors that have the same span of the moment vectors but are much more numerically stable. High approximation orders can be achieved by using these techniques. The clear and unambiguous inference inherent to the prior art is, therefore, that explicit moment matching around s=0 cannot be used to calculate high order approximations. While Krylov space methods are quite old, some new methods based upon Krylov space methods have been developed in the 1990's. These methods are more accurate than AWE, but are slow and are less accurate than CFH.

The foregoing background information, together with other aspects of the prior art, including those teachings useful in light of the present invention, are disclosed more fully and better understood in light of the following references, each of which is incorporated herein in its entirety.

[1] L. T. Pillage and R. A. Rohrer, "Delay Evaluation with Lumped Linear RLC Interconnect Circuit Models," *Proceedings of the Caltech Conference on VLSI*, pp. 143–158, May 1989.

[2] L. T. Pillage and R. A. Rohrer, "Asymptotic Waveform Evaluation for Timing Analysis," *IEEE Transactions on Computer-Aided Design*, Vol. CAD-9, No. 4, pp. 352–366, April 1990.

[3] T. K. Tang and M. S. Nakhla, "Analysis of High-Speed VLSI Interconnects Using the Asymptotic Waveform Evaluation Techniques," *IEEE Transactions on Computer-Aided Design*, Vol. CAD-11, No. 3, pp. 341–352, March 1992.

[4] C. L. Ratzlaff, *I Fast Algorithm for Computing the Time Moments of RLC Circuits*, Masters thesis, University of Texas at Austin, Austin, Tex., May 1991.

[5] C. L. Ratzlaff, N. Gopal, and L. T. Pillage, "RICE: Rapid Interconnect Circuit Evaluator," *Proceedings of the IEEE/ACM Design Automation Conference*, pp. 555–560, June 1991.

[6] D. F. Anastasakis, N. Gopal, S. Y. Kim, and L. T. Pillage, "On the Stability of Approximations in Asymptotic Waveform Evaluation," *Proceedings of the IEEE/ACM Design Automation Conference*, pp. 207–212, June 1992.

[7] R. Achar, M. S. Nakhla and Q. Zhang "Full-Wave Analysis of High-Speed VLSI Interconnects Using Complex Frequency Hopping," *IEEE Transactions on Computer-Aided Design*, Vol. CAD-17, No. 10, pp. 997–1016, October 1998.

[8] E. Chiprout and M. S. Nakhla, "Analysis of Interconnect Networks Using Complex Frequency Hopping," *IEEE Transactions on Computer-Aided Design*, Vol. CAD-14, pp. 186–200, February 1995.

[9] P. Feldmann and R. W. Freund, "Efficient Linear Circuit Analysis by Pade Approximation via the Lancozos Process," *IEEE Transactions on Computer-Aided Design*, Vol. CAD-14, No. 5, pp. 639–649, May 1995.

[10] P. Feldmann and R. W. Freund, "Reduced-Order Modeling of Large Linear Subcircuits via Block Lanczos Algorithm," *Proceedings of the IEE/ACM Design Automation Conference*, pp. 474–479, June 1995.

[11] M. Silveira, M. Kamon, and J. White, "Efficient Reduced-Order Modeling of Frequency-Dependent Coupling Inductances Associated with 3-D Interconnect Structures," *Proceedings of the IEEE/ACM Design Automation Conference*, pp. 376–380, June 1995.

[12] D. L. Boley, "Krylov Space Methods on State-Space Control Models," *Journal of Circuits, Systems, and Signal Processing*, Vol. 13, No. 6, pp. 733–758, May 1994.

[13] A. Odabasioglu, M. Celik, and L. T. Pillage, "PRIMA: Passive Reduced-Order Interconnect Macromodeling Algorithm," *IEEE Transactions on Computer-Aided Design*, Vol. CAD-17, No. 8, pp. 645–654, August 1998.

[14] P. Feldmann and R. W. Freund, "Reduced-Order Modeling of Large Passive Linear Circuits by Means of the SyPVL Algorithm," *Proceedings of the IEEE/ACM International Conference on Computer-Aided Design*, pp. 280–287, November 1996.

Objects of the Invention.

Accordingly, the prior art has associated with it numerous shortcomings and deficiencies, including those outlined above. AWE process time is directly proportional to "q," where "q" represents the number of reduced order poles. Process time associated with "Krylov Space Methods" is directly proportional to "$q^2$, but the "order" of the circuit ("n"=number of nodes) is also a factor in determining process time. As expressed above, AWE is commonly used for simple RC circuits. CFH is time consuming, but often applied where high-speed simulation isn't required, such as with microwave circuits. Today's large RLC circuits have very complex harmonics, and multiple circuit inputs. What is needed is a method that is both fast and accurate for today's more complex VLSI (very large scale integrated) circuits. It is, therefore, an object of the present invention to provide a method and/or apparatus for generating and analyzing a reduced-order model of a linear circuit, such method and apparatus as can simultaneously match the moments at several nodes of a circuit using explicit moment matching around s=0.

It will be understood by those skilled in the art that one or more aspects of this invention can meet certain objectives while one or more other aspects can meet certain other objectives. Each objective may not apply equally, in all its respects, to every aspect of this invention. As such, the following objects can be viewed in the alternative with respect to any one aspect of this invention.

It is an object of the present invention to provide an efficient method and apparatus for simulating linear and nonlinear circuits and systems using model order reduction.

Another object of the present invention is to provide an efficient method and apparatus for simulating linear and nonlinear circuits and systems using model order reduction using a moment matching technique which requires a significantly fewer number of moments than are required using known moment techniques for calculating a reduced order model.

Yet another object of the present invention to provide a moment matching technique the computational efficiency of which increases with the number of inputs to a circuit or system being simulated.

A further object of the present invention to provide a moment matching technique which is suitable for parallel processing.

It is a feature of the present invention that the moment matching technique requires only q+I moments, where q is the approximation order and I is the number of inputs of the circuit or system being simulated.

Another feature of the invention is to provide a model order reduction technique capable of achieving high order approximations that are not achievable using single-point explicit moment matching at even better computational efficiency.

Other objects, features, benefits and advantages of the present invention will be apparent from the following summary and descriptions of various preferred embodiments, and will be readily apparent to those skilled in the art having knowledge of various model order reduction and/or single moment matching techniques. Such objects, features, benefits and advantages will be apparent from the above as taken in conjunction with the accompanying examples, data, mathematical relationships, figures and all reasonable inferences to be drawn therefrom, alone or with consideration of the references incorporated herein.

SUMMARY OF THE INVENTION

The present invention provides methods and related apparatus, together with techniques, for simulating linear and nonlinear circuits by model order reduction using a multi-point moment matching (MMM) technique provided by the present invention. By exploiting the spatial information in the moments, the use of MMM significantly reduces the number of moments required to achieve a specific accuracy and thus, improves computational efficiency. As explained more fully below, the reduction in the number of moments by using MMM, rather than the SMM techniques of the prior art, increases with the number of inputs to the subject circuit.

Multi-point Moment Matching (MMM) techniques, methods and related apparatus simultaneously match moments at several nodes of a circuit using explicit moment matching around s=0. AWE has been referred to above as a Single-Moment Matching (SMM) method of circuit approximation because it looks at each node in isolation of other nodes an approach that creates inefficiencies in terms of processing time and numerical accuracy. The present invention provides a Multiple-Moment Matching (MMM) algorithm that does consider the inter-dependencies among multiple nodes, but does so in a manner that is highly efficient. As compared to the well-known Single-point Moment Matching (SMM) techniques (such as AWE), MMM has several advantages. First, the number of moments required by MMM is significantly lower than SMM for a reduced order model of the same accuracy, which directly translates into computational efficiency. This higher computational efficiency of MMM as compared to SMM increases with the number of inputs to the circuit. Second, MMM has much better numerical stability as compared to SMM. This characteristic of MMM allows the calculation of an arbitrarily high order approximation of a linear system, achieving the required accuracy for systems with complex responses. Finally, MMM is highly suitable for parallel processing techniques especially for higher order approximations while using SMM requires calculating the moments sequentially and SMM cannot be adapted to parallel processing techniques. The invention also lends itself to parallel processing, a feature that is very important when simulating today's multi-input circuits that have inherent interdependencies among the multiple inputs. As the number of inputs grows, the processing speed of the invention grows exponentially in contrast to that of the AWE and other Single-point Moment Matching methods. AWE, while fast, does not allow for parallel processing, which is important as the number of circuit inputs increase. Components of today's system circuits are effectively less isolated from one another, so that multiple inputs must be treated at once. By enabling parallel processing, the invention (MMM) not only is from 2–10 times faster than AWE, but also is much more accurate and numerically stable. MMM is simpler than CFH, and unlike CFH it allows for so-called "path tracing. This results from the fact that the present invention calculates poles around s=0, and that CFH calculates poles around multiple points." MMM is an explicit moment matching method. Prior to this invention, it was commonly believed that explicit moment matching methods around s=0 (calculating around s=0 simplifies things greatly) could not be used to calculate high-order approximations (high-order implying very large scale circuits). MMM takes advantage of certain "spatial" relationships to simplify circuit approximation while at the same time looking at interdependencies among nodes. The simplification reduces processing time, and treating nodes interdependently increases accuracy. Specifically, MMM enables the number of moments to be reduced, while at the same time it does so simply by viewing poles around s=0. Achieving both high accuracy and speed becomes important for circuits with complex responses. These can include circuit "interconnects" with capacitive and inductive coupling, power distribution networks and the like.

Determining a reduced order system of order q using the MMM technique requires only q+I moments, where q is the approximation and I is the number of inputs to the circuit. The MMM technique can be used with single input circuits or networks and/or multiple input circuits or networks. The MMM technique requires fewer moments because it exploits the fact that there is a common set of poles at all the nodes of a circuit or network. Because the q poles are common to all the nodes, adding an extra node only adds q new variables for q residues at the extra node. Therefore, the number of variables, when simultaneously considering q nodes, is q poles and $q^2$ residues, and the MMM technique needs only to match q(q+I) moments which are q+I moments at q nodes. Using only q+I moments instead of q(I+1) moments does not reduce the accuracy of an approximation based upon the MMM technique as compared to single point moment matching.

The numerical stability of a q order approximation calculated using the MMM technique increases as the number of inputs to the circuit increases. Therefore, in accordance with another aspect of the invention, in calculating some approximations, dummy inputs are introduced. The introduction of dummy inputs reduces truncation errors in high order approximations due to the high powers of the poles involved. Dummy inputs can be added until the maximum power of the poles in the approximation is sufficiently low to guarantee the numerical stability of the approximation.

Higher computational efficiency as compared to known techniques, allowing the MMM technique to calculate an arbitrarily high order approximation of a linear system, achieving the required accuracy for systems with complex responses. Moreover, the MMM technique is suitable for parallel processing techniques, especially for high order approximations.

In accordance with another aspect of the invention, there is provided an interconnect evaluator which uses the MMM technique to simulate very large scale integration (VLSI) interconnects. The MMM simulations can produce desired outputs, including circuit speed, power consumption, signal coupling noise and signal skew, for example.

Further in accordance with the invention, there is provided a nonlinear circuit simulator including a circuit linearizer, which linearizes the nonlinear circuit about an operating point, and a simulator based on the MMM technique for simulating the linearized circuit and determining a new operating point which is supplied to the circuit linearizer. Thus, the circuit is linearized several times and the resulting linear circuits are simulated. The simulations that are obtained are combined over time to represent the response of the nonlinear circuit.

In accordance with yet another aspect of the invention, there is provided a simulation engine incorporating the MMM technique for providing iterative optimization of a circuit design. The simulation engine evaluates the performance of the circuit in terms of key operating parameters, such as speed, power consumption and signal integrity. If the circuit performance does not meet the design goals, the circuit is modified based upon a circuit optimization algorithm and the performance is evaluated again. The iterative process is repeated until the circuit meets the design goals or reaches optimum performance.

DESCRIPTION OF THE DRAWINGS

These and other advantages of the present invention are best understood with reference to the drawings, in which.

DETAILED DESCRIPTION OF PREFERRED EMBODIMENTS

General Description

Figure 1:
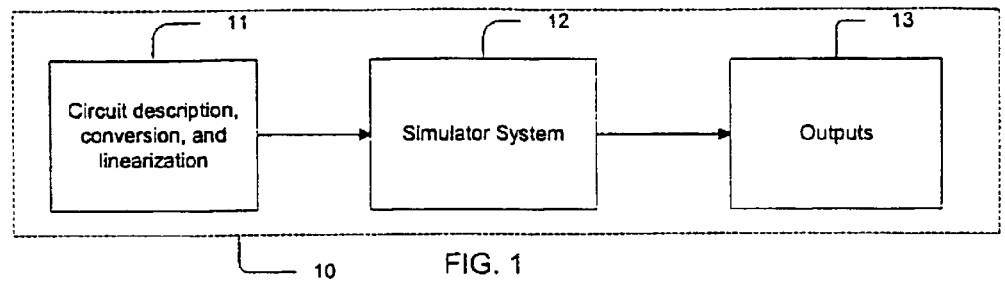
FIG. 1 is a functional block diagram of a circuit design system which includes an interconnect evaluator incorporating multi-point moment matching in accordance with the present invention.

Referring to the drawings, FIG. 1 is a simplified representation of a circuit simulating system 10 for use in the design and simulation of integrated circuits and/or systems. The circuit simulating system 10 includes a circuit design system 11 and a simulator system 12 which provides outputs, represented by block 13, such as speed of the circuit or system being simulated, power consumption by the circuit or system being simulated, coupling noise, signal skew, for example. The operation of the simulator system 12 is based on model order reduction techniques. In one embodiment, the simulator system 12 is an interconnect evaluator, hereinafter interconnect evaluator 12, which incorporates the multi-point moment matching (MMM) technique/apparatus provided by the present invention. The interconnect evaluator 12 provides verification of the design and operation of circuits or systems being simulated. The interconnect evaluator 12 can be configured to perform DC analysis, AC small signal analysis and transient analysis. The simulation is run and parameters can be adjusted by the designer to optimize the performance of the circuit or network being designed.

Digressing, in VLSI circuits and/or systems, the interconnects can be represented by linear circuits. As is known, the interconnect currently represents a large portion of the cycle time and it is important to accurately simulate its behavior. The MMM technique can be used directly without any additions or modifications to simulate VLSI interconnects.

Thus, one useful and important application of the MMM method/apparatus of this invention is for fast and accurate simulation of extremely dense integrated circuits and/or systems which operate at high frequencies. The interconnect evaluator 12 is advantageously used in simulating high density integrated circuits of the type that have several hundreds of millions of transistors and tens of millions of interconnect lines on a single chip with such a large number of elements, it is impossible to verify the performance of a chip in reasonable time using traditional simulation tools, such as dynamic simulators (SPICE and AS/X are examples) However, the interconnect evaluator 12 incorporating the MMM technique can handle very high dense circuits in a reasonable time frame. A simulator, such as the interconnect evaluator 12, incorporating the MMM technique can run many times faster than traditional dynamic simulators and is capable of calculating high order approximations with high efficiency. Although the MMM technique is described without limitation as an interconnect evaluator, additional applications illustrating use of the present invention and related MMM techniques are disclosed below.

More specifically, with reference to FIG. 1, the circuit design system 11 produces an interconnect description, including a listing of elements and connectivity which is provided to the interconnect evaluator 12 by the circuit design system 11. Preferably, the interconnect evaluator 12 is software based and is designed to accept the circuit description produced by the circuit design system 11. It will be understood by those having skill in the art that the entire microelectronic circuit may be described in terms of a "netlist" which defines component types, component values and component interconnects for all of the components of the integrated circuit. The netlist is then parsed, using techniques well known to those skilled in the art, to separate the interconnect elements from the active elements. The circuit description produced by the circuit design system 11 includes component types, component values and component interconnects (i.e., topology) for all of the components of the integrated circuit. For integrated circuits and/or systems which include nonlinear elements, the circuit design system linearizes the circuit or system prior to applying the circuit description to the MMM interconnect evaluator 12, as is known in the art.

As is described below, the interconnect evaluator 12 transforms the circuit description into an equivalent DC circuit containing resistors, inductors, and capacitors, and the equivalent DC circuit is converted into a direct graph. A spanning tree of the directed graph is traversed to obtain moments of the circuit which are then mapped into poles and residuals for the interconnect circuit. To allow matching the moments to the poles and residual, a reduced order state space system of order q is determined. To approximate the selected state variables of the original circuit or system, a reduced order system with the first q+I moments is calculated, where I is the number of inputs of the circuit or system. The residues of the transfer function poles between the input(s) and any state variable(s) in the original circuit or system are calculated. Once the poles and residues of the transfer functions at the nodes of interest are determined, the response of the circuit or system at these nodes to an arbitrary input is calculated using simple LaPlace transform techniques.

As will be shown, the way the moments are mapped into dominant poles and zeros is much more efficient than the way moments are mapped using known single point mapping techniques. As is described more fully below, the present invention can be applied generally to multiple input, multiple (or single) output systems, as well as to more specific situations involving single input, multiple (or single) output systems. The use of dummy inputs to arbitrarily improve the numerical characteristics of the present invention and/or related MMM techniques are also described.

As will be shown, the Multi-point Moment Matching methods and related apparatus of this invention explicitly match moments around s=0. As compared to a single moment matching (SMM) technique, the MMM technique has several advantages. The number of moments required using the MMM technique is significantly lower than when a single point method, such as AWE, is used in calculating a reduced order model of the same accuracy. Moreover, the higher computational efficiency of MMM as compared to SMM increases with the number of inputs to the circuit. Also, the MMM technique exhibits a much better numerical stability than is obtainable using a SMM technique, allowing calculation of higher order approximation of linear systems thereby achieving the required accuracy for systems with complex responses. In addition, the MMM technique is suitable for parallel processing, especially for higher order approximations. Single moment matching (SMM) techniques requires calculating the moments sequentially, and single moment matching techniques cannot be adapted to parallel processing techniques.

Computer System

Figure 2:
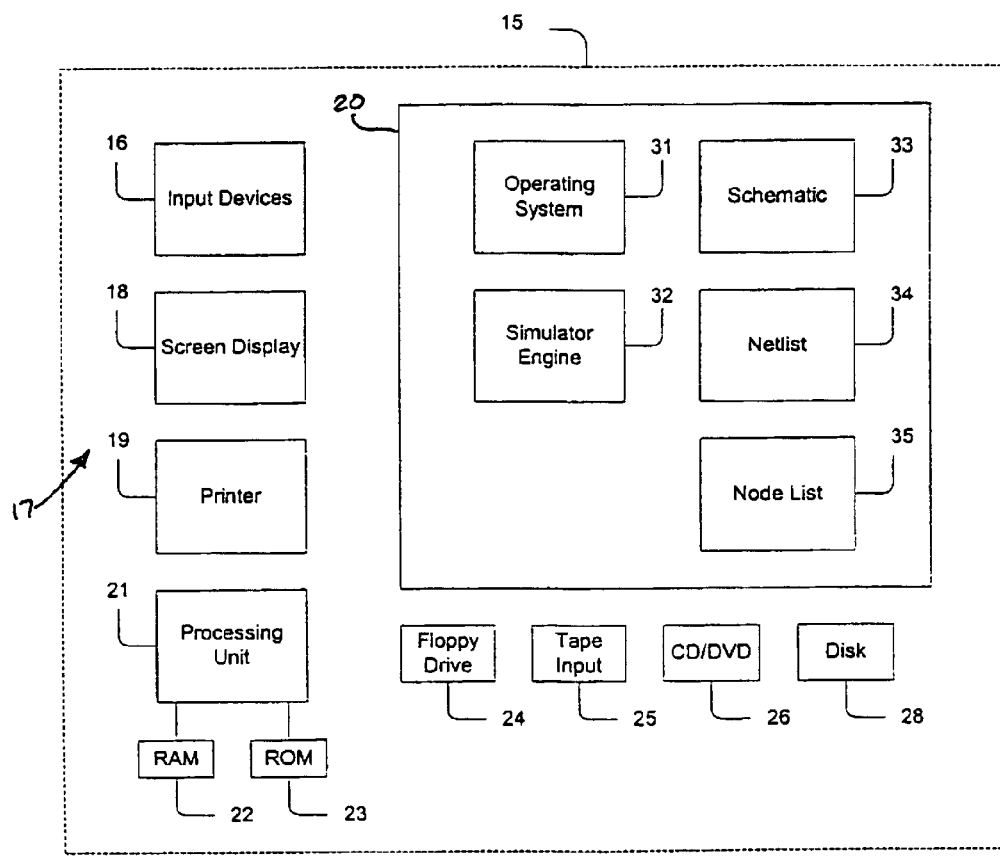
FIG. 2 is a block diagram of a computer system for carrying out the invention.

Referring to FIG. 2, in one preferred embodiment, the interconnect evaluator 12, which incorporates the multi-point moment matching (MMM) technique/apparatus provided by the present invention, is software based and is capable of being executed in a computer system 15 shown in block diagram form in FIG. 2. In one embodiment, the computer system 15 includes input devices 16, such as a keyboard or mouse, output devices 17, such as a display unit with a screen 18, a printer or plotter 19, storage devices 20 and a processing unit 21 having associated random access memory (RAM) 22 and read-only memory (ROM) 23. Preferably, the computer system is a workstation or a personal computer, for example. The computer system can include a floppy drive 24, a tape input 25, a CD-ROM and/or DVD-ROM drive 26 for receiving and storing information on computer readable media 28, such as CD-ROM or DVD-ROM disks. For example, the multi-point moment matching algorithm or program can be stored on one or more CD-ROM disks.

In one embodiment, the storage devices 20 include software programs and files which are used in carrying out simulations of circuits and/or systems, including multi-point moment matching in accordance with the invention. The programs and files of the computer system include an operating system 31 and the MMM interconnect circuit simulator engine for example. The programs and files of the computer system can also include or provide storage for a schematic 33, a netlist 34 and a node list 35 for a circuit or system being simulated. The processor is connected through suitable input/output interfaces and internal peripheral interfaces (not shown) to the input devices 16, the output devices 17, the storage devices 20, etc., as is known.

The computer system 15 can accept digital data representative of a circuit being simulated via a tape input or disk input, for example. Alternatively, the computer system can be used to produce a representation of a circuit in which case, the programs and files will include a suitable circuit design engine. The output devices 17 can be used to provide a visual display of results of circuit simulations.

MMM for a Single Input Multiple Output System

In part, the present invention is a method for simultaneously matching q+I moments at q points of a circuit where I is the number of inputs of the circuit. For the case of a single input, multiple output system, I=1. To increase the efficiency and accuracy of the simulation, MMM uses the state space representation of the circuit. Consider a linear circuit with n state variables (independent capacitor voltages and inductor currents). Out of the n state variables, q variables are selected to represent the circuit. These state variables are denoted $x_1, x_2, \ldots, x_q$ or x in vector notation. The qx1 vector $m_i$ includes the $i^{th}$ moments of the state vector x due to a unit impulse input. A reduced order state space system of order q can be determined which approximates the original circuit by simultaneously matching the moments of the selected q state variables x. This system is given by $$x = Ax + bu, \qquad (5)$$

where A is a qxq system matrix, b is a qx1 input vector, and u is the single input to the circuit. The state variables of the reduced order system have a one to one correspondence with the selected state variables from the original circuit $x_1, x_2, \ldots, x_q$. To approximate the selected state variables of the original circuit, a reduced order system with the first q+1 moments of $m_o, m_1, \ldots, m_q$ is determined. Equation (5) can be expressed in the frequency domain as $$s \cdot [m_0 + m_1 s + m_2 s^2 + \ldots + m_q s^q + \ldots] = A[m_0 + m_1 s + m_2 s^2 + \ldots + m_q s^q + \ldots] + b \cdot 1, \qquad (6)$$

where u(s) is equal to 1 for a unit impulse input. By comparing the coefficients of equal powers of s in both sides, the following relations have to be satisfied $$b = -Am_0, \qquad (7)$$

$$m_0 = Am_1,$$

$$m_0 = Am_2,$$

$$\vdots$$

$$m_{q-1} = Am_q.$$

By excluding the first equation (i.e. $b = -Am_0$, the equations above can be put in matrix form as $$A[m_1 m_2 \ldots m_q] = [m_0 m_1 \ldots m_{q-1}], \qquad (8)$$

Hence, a reduced order system can be determined which has the same q+1 moments of the original state original state variables using the following two equations $$A = \Lambda_1 \Lambda_2^{-1}, \qquad (9)$$

$$b = -Am_0, \qquad (10)$$

where $\Lambda_1$ and $\Lambda_2$ are two qxq matrices given by $$\Lambda_1 = [m_1 m_2 \ldots m_{q-1}], \qquad (11)$$

$$\Lambda_2 = [m_1 m_2 \ldots m_q]. \qquad (12)$$

The eigein values of A, $p_1, p_2, \ldots p_q$, are the reduced order common set of poles of the circuit. The residues of the transfer function between the input and any state variable $x_j$ in the original circuit can be calculated by solving the set of linear equations given by $$m_0^j = -\left(\frac{k_1^j}{p_1} + \frac{k_2^j}{p_2} + \ldots + \frac{k_q^j}{p_q}\right), \qquad (13)$$

$$m_1^j = -\left(\frac{k_1^j}{p_1^2} + \frac{k_2^j}{p_2^2} + \ldots + \frac{k_q^j}{p_q^2}\right),$$

$$m_{q-1}^j = -\left(\frac{k_1^j}{p_1^q} + \frac{k_2^j}{p_2^q} + \ldots + \frac{k_q^j}{p_q^q}\right).$$

Note that the state variable $x_j$ can be any variable in the original circuit and does not have to be one of the q variables used in calculating the reduced order system. Once the poles and residues of the transfer functions at the nodes of interest are determined, the response of the circuit at these nodes to an arbitrary input can be calculated using simple Laplace transform techniques.

Determining a reduced order system of order q for a single input circuit or system using the MMM technique requires q+1 moments ($m_0 - m_q$). The number of moments required for any SMM technique to determine a reduced order system of order q is 2q as discussed in articles [1]–[8] referenced above. Hence, only about half the number of moments are required by MMM as compared to SMM to calculate an approximation of the same order. The reason MMM uses fewer moments is that MMM exploits the fact that there is a common set of poles at all the nodes of a circuit. Because SMM considers only a single node at a time, SMM requires 2q moments to solve for 2q variables (q poles and their residues). However, by adding more nodes, the number of variables does not increase by 2q for each extra node. Since the q poles are common to all the nodes, adding an extra node only adds q new variables for q residues at the extra node. Hence, the number of variables when simultaneously considering q nodes is q poles and $q^2$ residues, and MMM needs only to match q(q+1) moments which are q+1 moments at q nodes.

Using only q+1 moments rather than of 2q moments does not reduce the accuracy of an approximation calculated based on MMM as compared to SMM. Although there is no formal proof for this argument, this trait can be illustrated in several ways. Intuitively, although MMM uses fewer moments, the reduced order system in equation (5) represents the original circuit more closely by matching the circuit characteristics at more than one point rather than at a single point. Alternatively, in the special case when q=n, MMM exactly matches the circuit using n+1 moments while SMM requires 2n moments to exactly match the circuit.

Figure 3:
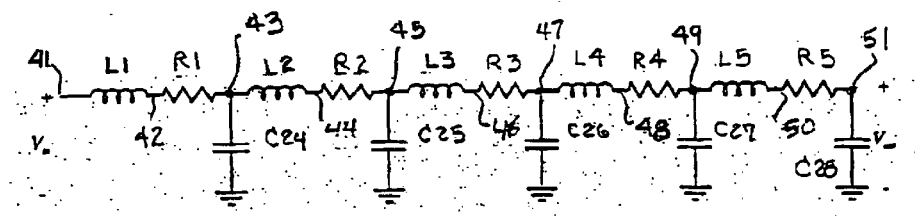
FIG. 3 is a schematic diagram of a simple RLC circuit.

For example, referring to FIG. 3, there is shown a simple RLC circuit 40 including resistors R1–R5, inductors L1–L5 and capacitors C24–C28. The circuit has eleven nodes 41–51. By way of example, the resistance value for each of the resistors R1–R5 is 0.4 and the inductance value for each of the inductors L1–L5 is 1.4. The capacitance value of capacitors C24–C27 is 0.3, and the capacitance value of capacitor C28 is 0.15. Units are not specified for circuit elements and time because the whole problem can be scaled.

To illustrate the accuracy of a qth order approximation using MMM and SMM, 10th, 8th and 4th order approximations were calculated for the simple RLC interconnect circuit shown in FIG. 3 and compared with a SPICE simulation. The voltage output $V_{out}$ was taken from node N51 as the input voltage was varied $V_{in}$.

Figure 4:
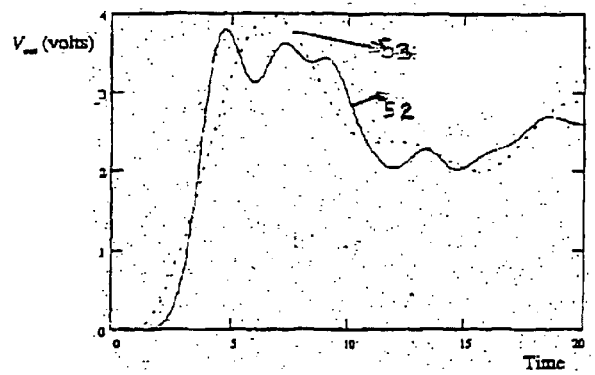
FIG. 4 is graph showing 10th order multi-point moment matching and single-point moment matching approximations as compared to SPICE simulations for output voltage of the circuit of FIG. 3.

FIG. 4 illustrates the results of the 10th order MMM and SMM approximations and SPICE simulation for output voltage $V_{out}$, in volts, as a function of time for the circuit of FIG. 3. In FIG. 4, curve 52 illustrates the results of loth order MMM approximation and a SPICE simulation. Curve 53 illustrates the results of 10th order SMM approximation. As is shown by curve 52 and 53, the MMM approximation replicates the exact response at all eleven nodes 41–51 using eleven moments for the output. In contrast, the SMM approximation requires twenty moments and breaks due to numerical errors when using a sixteen significant decimal digit arithmetic.

Figures 5, 6:
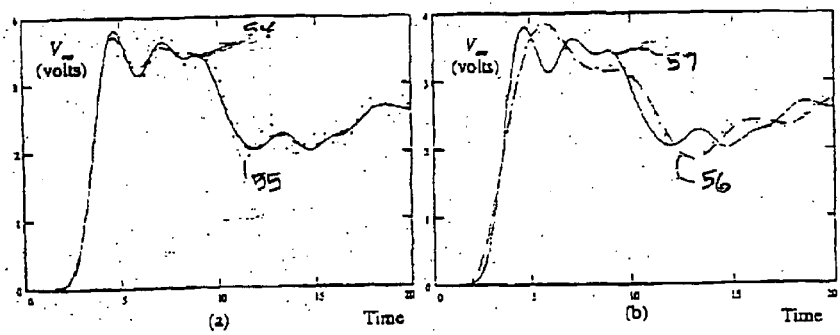
FIGS. 5 and 6 are graphs illustrating 8th and 4th order multi-point moment matching and single-point moment matching approximations, respectively, as compared to SPICE simulations for the output voltage of the circuit of FIG. 3.

FIG. 5 illustrates the results of the 8th order MMM and SMM approximations and a SPICE simulation for the output voltage, in volts $V_{out}$, as a function of time for the circuit of FIG. 3. In FIG. 5, curve 54 illustrates the results of the 8th order MMM approximation and SPICE simulation and curve 55 illustrates the results of the 8th order SMM approximation. As can be seen by comparing curve 54 with curve 55, for an 8th order approximation, MMM is more accurate than the SMM.

FIG. 6 illustrates the results of 4th order MMM and SMM approximations and SPICE simulation for the output voltage $V_{out}$, in volts, as a function of time for the circuit of FIG. 3. In FIG. 6, curve 56 illustrates the results of the 4th order MMM and SMM approximations and curve 57 illustrates the results of the SPICE simulation. As can be seen from curve 57, for a 4th order approximation, MMM is as accurate as SMM.

Another way to illustrate the similar accuracy of a $q^{th}$ order approximation using MMM and SMM is to note that both techniques implicitly solve the same sets of equations (4) and (13) to find q poles and q residues. The only difference is that MMM solves the system of equations more efficiently by exploiting the fact that there is a common set of poles at all the nodes.

The selection of the q variables used in calculating a MMM reduced order model is an important aspect relating to the accuracy of the MMM approximation. For example, if two state variables with exactly the same moments are selected, two identical rows appear in $\Lambda_2$ and the matrix can not be inverted as required by equation (9). The choice of two state variables with close moments can also cause loss of accuracy. The state variables are preferably selected with moments as far way as possible. Digressing, any linear circuit has many nodes in it, as is evident from the circuits shown in FIGS. 3, 7 and 10, for example. Each node has a different response. For example, nodes closer to the input have faster responses than nodes further down stream. The moments of different responses are different and the more diverse the responses are at different nodes the more diverse the moments are. The moments have to be calculated at all the nodes anyway. So after the moments are calculated, the first moment can be used as criterion to determine how diverse the responses are. The first moment can be sorted and the nodes corresponding to far away moments are selected as the g state variables. For example, if the first moment at different nodes vary as 1, 2, 3, 5, 7, 9, 10, 12, and 14, a third order approximation can be used with the state variables with moments of 1, 7, and 14.

A way to achieve this objective is to sort the state variables in terms of the first moment and select the variables at equidistant steps starting with the variable with the smallest moment and ending with the variable with the largest moment. The variables are selected, if inductors are present in the circuit, both inductor currents and capacitor voltages should be selected as state variables when calculating the reduced order model. Intuitively, by choosing the variables according to these criteria, the circuit is more comprehensively sampled and hence is more accurately approximated by the reduced order model. Also, in many cases the q variables are implied by the physical nature of the circuit.

Consistent with this invention, MMM does not use the higher half of the moments which SMM uses for the same approximation order q. Thus, the maximum power of the poles in the system of equations solved by MMM is almost half that of SMM. As described in section I, the high powers of the poles are the primary reason for numerical instability in SMM techniques. Hence, MMM is numerically more stable than SMM. This is evident in FIG. 4. Although the numerical advantage of MMM by using half the moments of SMM is not huge, it is shown in section III that both the numerical and computational advantages of MMM over SMM increase in direct proportion to the number of inputs to the circuit. This aspect is utilized below by using dummy inputs to arbitrarily improve the numerical characteristics of MMM, allowing the calculation of approximations with practically any required number of poles.

Finally, moment shifting can be readily applied in MMM and was shown in [6] to improve the accuracy of moment matching approximations by eliminating the inaccuracy effects of larger magnitude poles on the dominant poles. A reduced order system of the form in equation (5) can be calculated with a moment shifting of sh by using equation (9) with $$\Lambda_1 = [m_{sh} m_{sh+1} \ldots m_{sh+q-1}], \quad (14)$$

$$\Lambda_2 = [m_{sh+1} m_{sh+2} \ldots m_{sh+q}], \quad (15)$$

and $$b = -A^{sh+1} m_{sh}. \quad (16)$$

A shift between 1–3 usually results in significant accuracy improvement of the reduced order model. If the moments are shifted too much, the information about the larger poles gets lost. Typically, the moment shifting is based on the type of circuit simulated. RC circuits have good pole separation, and thus generally there is no need to use any shifting (sh=0). For RLC circuits, a moment shifting of two is typical to improve the pole separation in the moments. Equation (3) shows the relation between moments and the poles. The higher moments increase the separation of the poles.

MMM for a Multiple Input, Multiple Output System

For a circuit with I inputs, a reduced order system of the form $$x = Ax + Bu, \qquad (17)$$

is used as a q order approximation of the original circuit, where B is a q×I input matrix and u is an I×1 vector including the inputs to the circuit. This reduced order system can be expressed as $$x = Ax + b_1 u_1 + b_2 u_2 + \ldots + b_I u_I, \qquad (18)$$

where $u_1-u_I$ are the I inputs and $b_1-b_I$ are the corresponding columns of B. Unlike the single input case described above, there are I different sets of moment vectors that can be calculated for the multiple input system expressed as equation (18). A different set of moment vectors results from setting one input as a unit impulse while all the other inputs are set to zeros. The set of moment vectors corresponding to the input $u_k$ are denoted $m_{0,k}, m_{1,k}, \ldots$, where $m_{i,k}$ includes the $i^{th}$ moments of the q state variables in x selected to represent the circuit. Note that these moments are the moments of the transfer functions between input k and the state variables of the circuit since a circuit with I inputs has I different transfer functions at each node j as described by $$x_j(s) = H_1^j(s) u_1(s) = H_2^j(s) u_2(s) + \ldots = H_I^j(s) u_I(s). \qquad (19)$$

Following the same procedure as in the single input case, the following relations can be shown to hold when matching the moments of the reduced order system to the moments of the q variables $x_1, x_2, \ldots x_q$ of the original circuit $$b_k = -A m_{0,k}'$$

$$m_{i,k} = A m_{i+1,k}' \qquad (20)$$

for any i=0, 1, 2, ... and any k=1, 2, ..., I. Any q+I moment vectors can be used to completely determine an approximation of the reduced order system expressed by equation (18) of order q since equation (18) has (q+I)q variables ($q^2$ elements in A and qI elements in $b_1-b_I$). The only condition is that at least $m_{o,k}$ needs to be determined for all the inputs (k=1 ... I) to determine $b_k$ as described by equation (20). Hence, A can be determined using equation (9) with several different alternatives for $\Lambda_1$ and $\Lambda_2$. One interesting choice is $$\Lambda_1 = \left[ m_{0,1} m_{1,1} \ldots m_{\frac{q}{I}-1,1} m_{0,2} m_{1,2} \ldots m_{\frac{q}{I}-1,2} \ldots m_{0,I} m_{1,I} \ldots m_{\frac{q}{I}-1,I} \right], \qquad (21)$$

$$\Lambda_2 = \left[ m_{1,1} m_{2,1} \ldots m_{\frac{q}{I},1} m_{1,2} m_{2,2} \ldots m_{\frac{q}{I},2} \ldots m_{1,I} m_{2,I} \ldots m_{\frac{q}{I},I} \right], \qquad (22)$$

which uses the first q/I+1 moments corresponding to each input u2- uI.

The eigen values of A, $p_1—p_q$, represent the common set of poles of the circuit. The number of residues at each node is qI since there are q residues corresponding to each of the I inputs of the circuit. The number of moments calculated at each node is only g+I and hence, it may seem impossible to determine the qI residues at each node. However, for any linear system, the residues of the transfer functions due to different inputs are not completely independent since the residue vectors are related to the eigen vectors of A by $$k_{1,k} = \alpha_{1,k} v_1,$$
$$k_{2,k} = \alpha_{2,k} v_2, \qquad (23)$$
$$\vdots$$
$$k_{q,k} = \alpha_{q,k} v_q,$$

for k=1 ... I where $k_{i,k}$ is a vector including the residues of the $i^{th}$ pole $p_i$ at the q variables x ... x ..., $x_q$ due to $u_k$. $v_i$ is the eigen vector of A corresponding to the $i^{th}$ pole $p_i$ and $\alpha_{1,k}-\alpha_{q,k}$ are a set of q constants unique to each input $u_k$. This set of constants can be expressed in vector notation as $\alpha_k$ and is determined from $$\alpha_k = T^{-1} b_k, \qquad (24)$$

where $$T = [v_1 v_2 \ldots v_q], \qquad (25)$$

as explained in APPENDIX I. Note that the above relations hold for any linear system and therefore are also valid for the original circuit of dimension n (or when q=n). Hence, the residues due to different inputs are just the scaled eigen vectors of A. The set of constants $\alpha_{1,k}-\alpha_{q,k}$ are common to all nodes and define the ratios between the residues due to different inputs. Note that by using equation (23), the moments due to input k which are given by $$m_{1,k} = -\left[ \frac{1}{p_1^{i+1}} k_{1,k} + \frac{1}{p_2^{i+1}} k_{2,k} + \ldots + \frac{1}{p_q^{i+1}} k_{q,k} \right], \qquad (26)$$

are equivalent to $$m_{1,k} = -\left[ \frac{\alpha_{1,k}}{p_1^{i+1}} v_1 + \frac{\alpha_{2,k}}{p_2^{i+1}} v_2 + \ldots + \frac{\alpha_{q,k}}{p_q^{i+1}} v_q \right], \qquad (27)$$

Hence, to determine the residues at any node, the eigen values of A $p_1-p_q$ and the corresponding eigen vectors $v_1-v_q$ are first calculated. The set of constants $\alpha_{1,k}-\alpha_{q,k}$ which are common to all the nodes in the circuit are determined from equations (24) and (25). The residues at any node j can be determined directly from equation (23) if j belongs to the reduced order system. For any other node j in the original circuit, the $j^{th}$ components of the eigen vectors $v_1^j-v_q^j$ have to be determined by solving the q linear equations given by $$m_{0,k}^j = -\left( \frac{\alpha_{1,k}}{p_1} v_1^j + \frac{\alpha_{2,k}}{p_2} v_2^j + \ldots + \frac{\alpha_{p,k}}{p_q} v_q^j \right), \qquad (28)$$

$$m_{1,k}^j = -\left( \frac{\alpha_{1,k}}{p_1^2} v_1^j + \frac{\alpha_{2,k}}{p_2^2} v_2^j + \ldots + \frac{\alpha_{q,k}}{p_q^2} v_q^j \right),$$

$$m_{\frac{q}{I}-1,k}^j = -\left( \frac{\alpha_{j,k}}{p_1^{\frac{q}{I}}} v_1^j + \frac{\alpha_{2,k}}{p_2^{\frac{q}{I}}} v_2^j + \ldots + \frac{\alpha_{q,k}}{p_q^{\frac{q}{I}}} v_q^j \right),$$

for k=1 ... I where $v_i^j$ is the component of the $i^{th}$ eigen vector at node j. Note that the poles $p_1-p_q$ and the constants $\alpha_{1,k}-\alpha_{q,k}$ are known in (28) since they are determined from the reduced order system and are common to all nodes. The residues at node j can then be determined using the $j^{th}$ component of equation (23) given by $$k_{i,k}^j = \alpha_{1,k} v_i^j, \qquad (29)$$

MMM requires q+I moments to determine an approximation of order q for a circuit with I inputs. The number of moments required for SMM is at least q+qI moments to determine q common poles and q residues for each of the I inputs. Note that the savings in the number of moments required by MMM as compared to SMM increases dramatically with the number of inputs to the circuit especially a large value for q. This savings is again because MMM exploits the fact that the poles $p_1$–$p_q$ and the constants $\alpha_{1,k}$–$\alpha_{q,k}$ are common to all the nodes in the circuit. By considering only one node, SMM techniques cannot exploit this fact.

Figure 7:
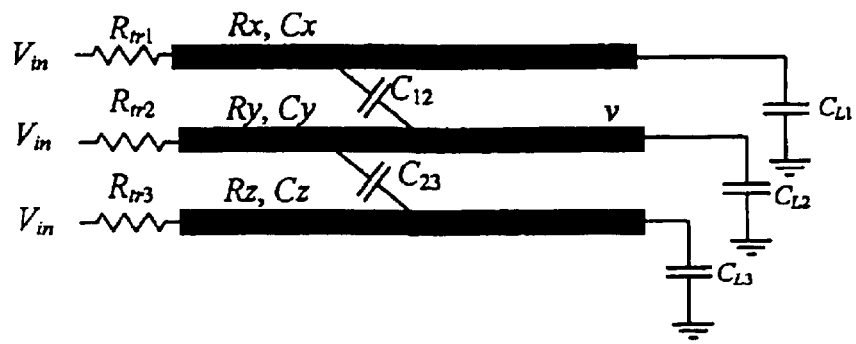
FIG. 7 is a schematic representation of three RC-coupled transmission lines.

For example, consider the three capacitively coupled RC transmission lines shown in FIG. 7 and having inputs 61, 62 and 63, respectively. The circuit element values are: Rx=0.8, CX=1, $R_{ir1}$=0.5, $C_{L1}$=1, Ry=0.5, Cy=0.5, $R_{ir2}$=0.5, $C_{L2}$=0.5, Rz=0.2, Cz=2, $R_{ir3}$=1, $C_{L3}$=1, $C_{12}$=2, $C_{23}$=3. A third order MMM approximation is used to simulate the circuit. The outputs of the three transmission lines are chosen as the three variables representing the circuit. The first two moments, $m_{0,k}$ and $m_{1,k}$, are calculated for each of the three inputs, i.e., k=1, 2, and 3. The approximation is then calculated using $$\Lambda_1 = [m_{0,1} m_{0,2} m_{0,3}], \Lambda_2 = [m_{1,1} m_{1,2} m_{1,3}]. \qquad (30)$$

Figure 8:
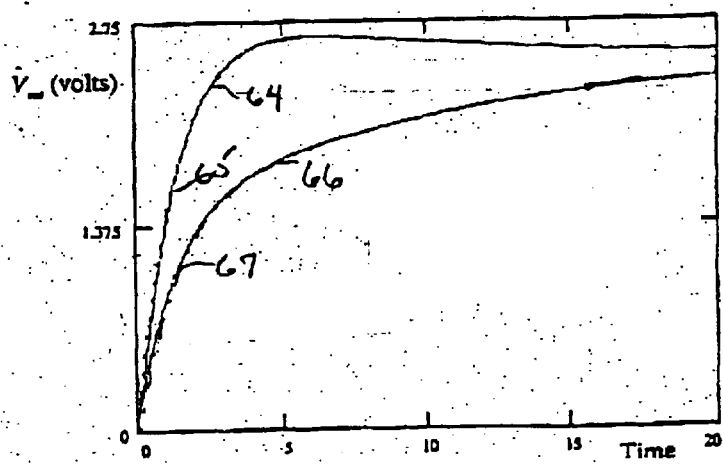
FIG. 8 is a graph illustrating a 3rd order multi-point moment matching approximation as compared to SPICE simulations for the RC-coupled transmission lines of FIG. 7.

The $3^{rd}$ order MMM approximation is compared to SPICE in FIG. 8 and accurately approximates the transient response of the circuit for different input switching conditions. Note that a MMM approximation does not need to be recalculated for different inputs. The total number of moments calculated by MMM is six. A $3^{rd}$ order SMM approximation requires at least 12 moments. Moreover, $m_{0,k}$ can usually be calculated trivially for most VLSI interconnects. Hence, the actual number of moments that are calculated by MMM is three as compared to nine by SMM, which illustrates the efficiency of MMM as compared to SMM. This efficiency is even higher for circuits with a higher number of inputs. Also, the three moments $m_{1,1}$, $m_{1,2}$, and $M_{1,3}$, are independent and these three moments can be calculated simultaneously using parallel processing in a time equivalent to that of calculating the Elmore delay. As for SMM, five moments due to one of the inputs have to be calculated sequentially to determine a common set of poles for the circuit.

FIG. 8 illustrates the results of a 3rd order MMM approximation and SPICE simulation for the output voltage $V_{out}$, in volts, as a function of time for the circuit of FIG. 7 under different input switching conditions. In FIG. 8, curves 64–65 illustrate, respectively, the results of the 3rd order MMM and approximation and SPICE simulation for the condition where all of the inputs 61–63 are switching from a logic low level to a logic high level. Curves 66 and 67 illustrate, respectively, the results of the 3rd order MMM and approximation and SPICE simulation for the condition where inputs 61 and 62 are switching from a logic low level to a logic high level while input 63 switches from a logic high level to a logic low level.

A related aspect of this invention is that the numerical stability of a q order approximation based on MMM increases as the number of inputs to the circuit increase. This behavior can be explained by observing that the maximum power of the poles in equations (21)–(29) is (q/I+1). Hence, for a given A, an increase in I results in a direct improvement in the numerical stability of the reduced order model. Note that the maximum power of the poles in an SMM approximation of order q is 2q independent of the number of inputs to the circuit. For example, for a 40th order approximation, the maximum power of the poles is 80 in SMM and only five in the case of MMM with ten inputs to the circuit, which is a significant difference. While most typical circuits have less than ten inputs, dummy inputs can be arbitrarily introduced as discussed in the next section, allowing fine control of the numerical characteristics of an MMM approximation. In the limit, the highest power of the poles in a MMM approximation of any order can be limited to two in the special case when q=I. The minimum power of the poles in an MMM approximation can also be controlled by employing moment shifting [6], allowing an even greater control of the numerical characteristics of an MMM approximation. Equation (9) can be used to determine a reduced order multiple input system with a moment shifting of sh by using $$\Lambda_1 = [m_{sh,1} m_{sh+1,1} \ldots m_{sh+\frac{q}{I}1,1} m_{sh,2} m_{sh+1,2} \ldots \qquad (31)$$
$$m_{sh+\frac{q}{I},2} \ldots m_{sh,1} m_{sh+1,1} \ldots m_{sh+\frac{q}{I}1,1}],$$

$$\Lambda_2 = [m_{sh+1,1} m_{sh+2,1} \ldots m_{sh+\frac{q}{I},1} m_{sh+1,2} m_{sh+2,2} \ldots \qquad (32)$$
$$m_{sh+\frac{q}{I},2} \ldots m_{sh+1,1} m_{sh+2,1} \ldots m_{sh+\frac{q}{I},1}],$$

and $$b_k = -A^{sh+1} m_{sh,k}, \qquad (33)$$

for k=1,2, . . . I.

Figure 9:
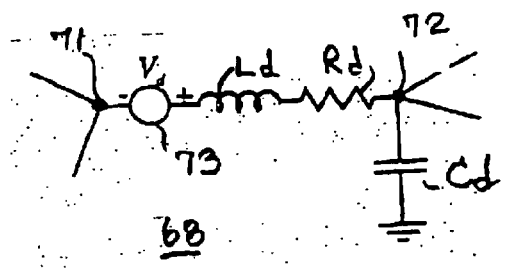
FIG. 9 is a schematic diagram of a circuit including a dummy input.

Controlling Numerical Characteristics of an MMM Approximation Using Dummy Inputs As discussed above, the maximum power of the poles in an MMM approximation decreases as the number of inputs to the circuit increases. This improves the numerical stability of the reduced order model. In many cases, circuits with a single or only a few inputs require high order approximations to accurately characterize the transient response of the circuit. In such cases, dummy inputs can be introduced to reduce the truncation errors in high order approximations due to the high powers of the poles involved. After the reduced order model is calculated, the dummy inputs can be set to zero in the reduced order model. The added dummy inputs should satisfy two conditions. First, setting a dummy input to zero should not change the circuit structure. For example, setting to zero a voltage source in parallel with a capacitor results in short circuiting the capacitor, changing the original circuit. Second, the moment vectors due to a dummy input should be easily calculated by using path tracking techniques [4], [5] where they apply. Also, if matrix factorization is necessary for calculating the moments due to the original inputs, calculating the moments due to a dummy input should not require any extra matrix factorization than that required by the original inputs. One input that satisfies these conditions is a voltage source 70 in series with an inductor Ld or a resistor Rd in the linear circuit 68 as shown in FIG. 9. As shown in FIG. 9, in the circuit 68, voltage source 70 is connected in series with the resistor $R_d$ and the inductor $L_d$ between a node 71 and a node 72. A capacitor $C_d$ is connected between node 72 and ground. The negative polarity terminal of the voltage source 70 is connected to node 71 and the positive polarity terminal of the voltage source 70 is connected to a terminal of the inductor $L_d$ at a node 73.

Figure 10:
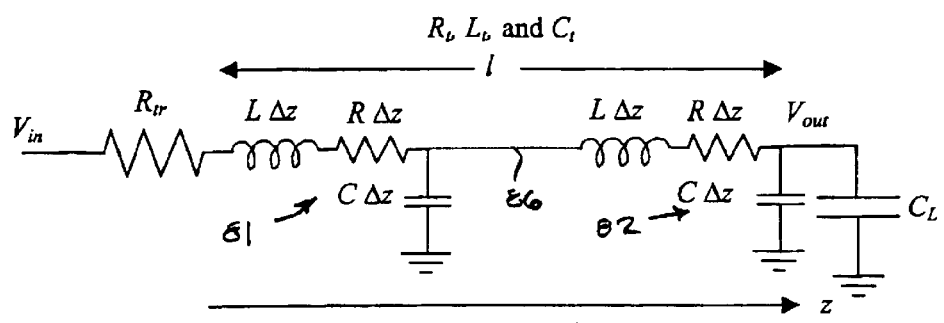
FIGS. 10 and 10A are schematic diagrams of a circuit, and the circuit with a plurality of dummy inputs added.
Figure 10A:
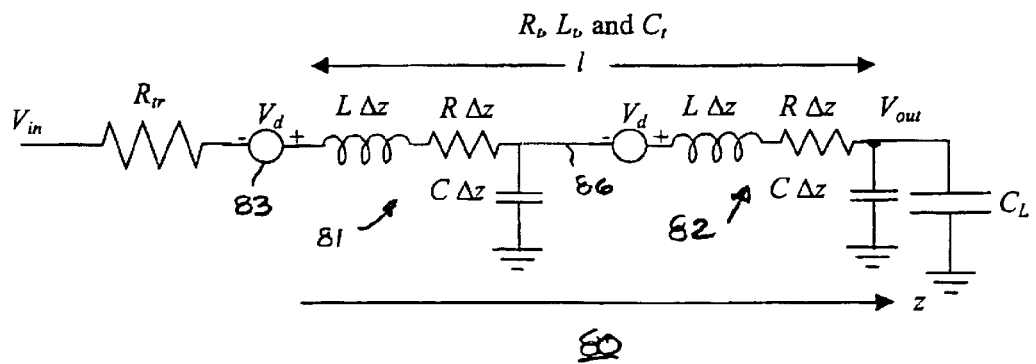

FIG. 10 is another example of a circuit 80 to which dummy inputs, represented by voltage sources $V_d$, have been added, as illustrated in FIG. 10A. The circuit 80 includes a plurality of branches, such as branches 81 and 82, each including a dummy input (voltage source 83), an inductor L$\Delta$z, a resistor R$\Delta$z and a capacitor C$\Delta$z connected in the manner of circuit 68 (FIG. 9). Although only two branches 81 and 82 are shown, the circuit 80 can have more than two branches as represented by the dashed line 86 between branch 81 and branch 82. Circuit 80 can represent an underdamped RLC transmission line, for example.

In both exemplary circuits 68 and 80, the voltage sources 70 and 83 are not connected in parallel with any element in the circuits and are not connected between any node and the ground. It can be easily verified that such input satisfies the two conditions above.

Dummy inputs of this type can be added until the maximum power of the poles in the MMM approximation are sufficiently low to guarantee the numerical stability of the approximation. However, to achieve the maximum linear independence between the moment vectors due to different inputs, the inputs should be selected at nodes that are physically far from each other. The first moments due to one of the original inputs can be used again as a criterion to determine where the dummy inputs should be located.

For example, consider an underdamped RLC transmission line with a total resistance of 2, inductance of 1, and capacitance of 1.5. An underdamped transmission line is known to have one of the most complicated responses in all single input circuits with a large number of poles significantly affecting the transient response. Applying the SMM technique at the load node using 16 significant decimal digit arithmetic, only an eighth order approximation can be reached before running into serious numerical errors. In contrast, by applying the MMM technique with nine dummy inputs (a total of ten inputs including the original input) introduced at equal distances starting from the source and ending at the load, a 40th order approximation is accurately calculated. A moment shifting of two (sh=2) was used with in the MMM approximation.

Figure 11:
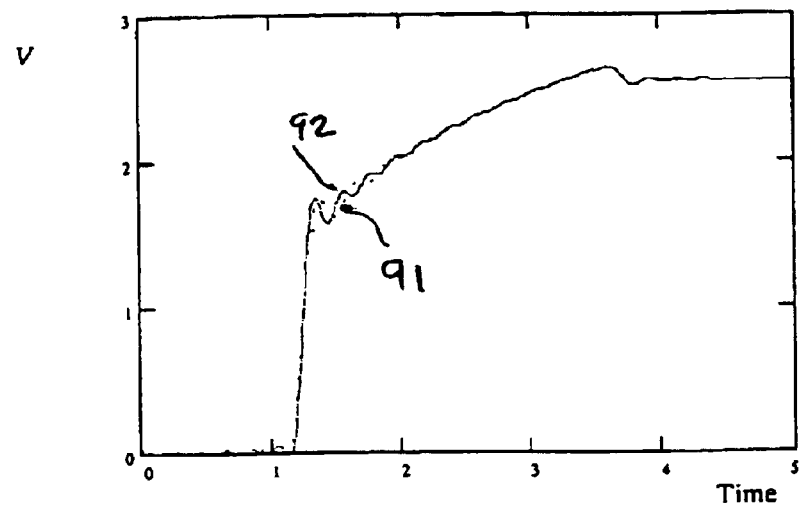
FIG. 11 is a graph illustrating a multi-point moment matching approximation of order 40 as compared to SPICE simulations of the output of an underdamped RLC transmission line.

FIG. 11 illustrates the results of a 40th order MMM approximation and a SPICE simulation for the output voltage $V_{out}$, in volts, as a function of time for an underdamped transmission line under different input switching conditions. In FIG. 11, curve 91 illustrates the results of the 40th order MMM approximations and curve 92 illustrates the results of the SPICE simulation. As can be seen by comparing curves 91 and 92, the 40th order MMM approximation closely follows the SPICE simulation as shown in FIG. 11. The 40th order approximation requires the calculation of seventy moments around s=0. The maximum error in any of the poles calculated using MMM was less than 2.5% as compared to the exact poles. The seventy moments used in the above example are composed of seven moments for each of the ten inputs. Two of the seven moments are needed because the moment shifting of two requires the calculation of two additional moments for each of the ten inputs of the exemplary circuit, or twenty additional moments. These ten sets of seven moments do not depend on each other and can be calculated in parallel. As for SMM or Krylov subspace methods [9]–[14], the moment vectors (or the equivalent vectors in the case of Krylov-based methods) have to be calculated sequentially and thus, parallel programming techniques cannot be employed. This advantage of the MMM technique can be significant especially when higher order approximations are required which will usually involve a large number of moment sets due to different inputs with each set having only few moments to limit the maximum power of the poles in the approximation.

Figure 12:
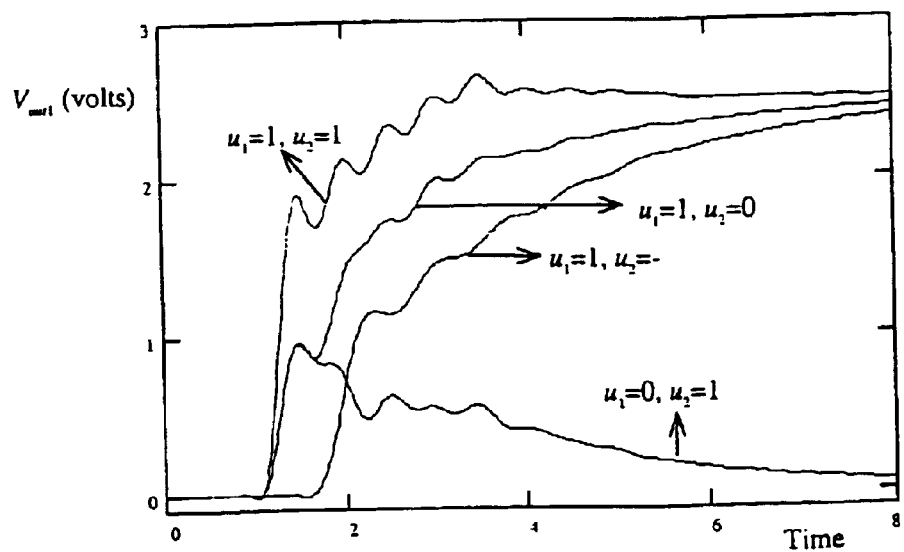
FIG. 12 is a graph illustrating a multi-point moment matching approximation of order 40 as compared to SPICE simulations at the output of one line of two coupled identical RLC transmission lines.

Finally, consider the case of two identical coupled RLC transmission lines. A $40^{th}$ order approximation is calculated using MMM with ten inputs (eight dummy and two original inputs) and a moment shifting of two. The approximation matches accurately SPICE simulations at the end of line one for several input switching conditions as shown in FIG. 12. Seventy moments are used again which represents no increase as compared to the single transmission line example above. A sixteen significant decimal digit arithmetic was used. Note that transmission lines are used here not because of their simplicity but rather because transmission lines involve some of the most complicated signals in linear circuits and because the presented results can be easily verified. MMM can be used with any linear circuit for which the moments can be calculated.

FIG. 12, illustrates the results of an MMM approximation of order 40 as compared to SPICE simulations at the output of one line 101 of two coupled identical RLC transmission lines 101 and 102. The total resistance $R_{101}$ and $R_{102}$, inductance $L_{101}$ and $L_{102}$ and capacitance $C_{101}$ and $C_{102}$ of the two lines 101 and 102 are 2, 1, and 1.5, respectively, and the coupling capacitance $C_c$ between the two lines 101 and 102 is 1. The parameters $u_1$ and $u_2$ take the values 1, 0, or −1 indicating that the corresponding line is switching from low to high, not switching, or switching from high to low, respectively. Curve 104 represents the results of the approximation for the case in which both lines 101 and 102 are switching from low to high ($u_1$=$u_2$=1). Curve 105 represents the results of the approximation for the case in which line 101 is switching from low to high and line 102 is not switching ($u_1$=1, $u_2$=0). Curve 106 represents the results of the approximation for the case in which line 101 is switching from low to high and line 102 is switching from high to low ($u_1$=1, $u_2$=−1). Curve 107 represents the results of the approximation for the case in which line 101 is not switching and line 102 is switching from low to high ($u_1$=0, $u_2$=1). The MMM approximation is indistinguishable from SPICE simulations.

Interconnect Evaluator Operations

Figure 13:
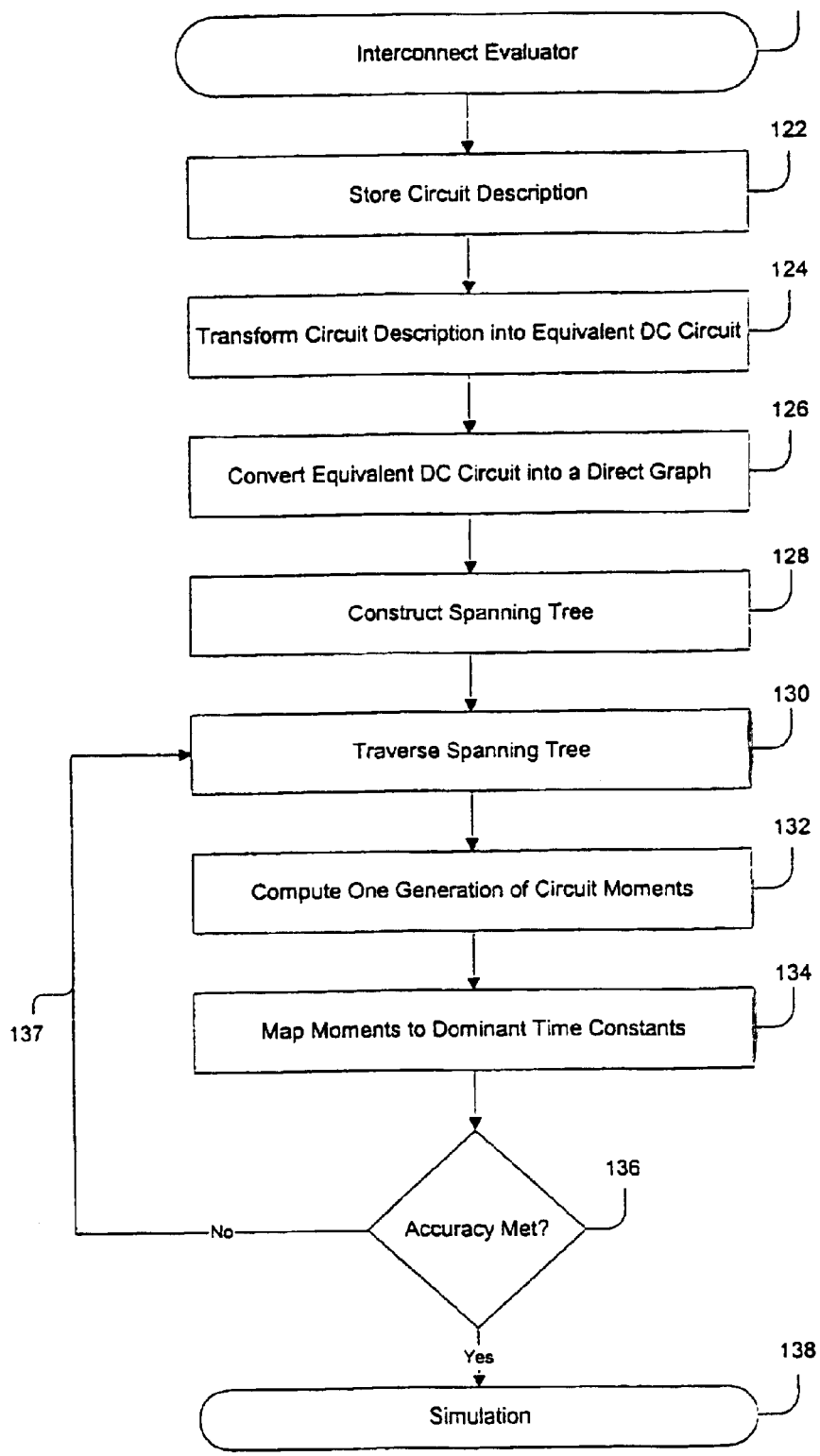
FIG. 13 is a process flow chart for the operations of the interconnect evaluator of the simulating system FIG. 1.

Referring now to FIG. 13, there is illustrated an overview of the operations performed by the interconnect evaluator 12 of the circuit simulating system 10 (FIG. 1), according to the present invention. By way of example, the operations of the interconnect evaluator 12 are described with reference to the RLC circuit of FIG. 3, which is a single input circuit. Calculation of the reduced order system can be carried out using equations (9)–(12) derived above for the case of single input circuits and systems. It will be understood that the description which makes reference to the circuit of FIG. 3, which is a single input circuit, is non-limiting, and that more complicated interconnect circuits are typically simulated. For example, the operations are similar for multiple input circuits and/or systems, and calculation of a reduced order system for a multiple input circuits and/or systems is carried out using equation (30) derived above.

Figure 14:
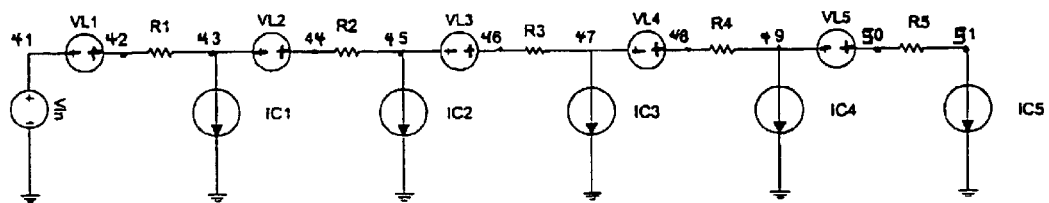
FIG. 14 is a schematic diagram of the RLC circuit of FIG. 3 transformed to its equivalent circuit.

Referring to FIG. 13, briefly, in the first step for producing a set of moments for the linear passive RLC circuit, Block 122 inputs and stores the description of the interconnect circuit. Techniques for storing a circuit description for interconnect circuits are well known to those skilled in the art and need not be described further herein. Then, in Block 124, the circuit description of the interconnect circuit is transformed into an equivalent DC circuit. This can be done by replacing all capacitors with current sources replacing and all inductors with voltage sources. FIG. 14 is a schematic diagram of the RLC circuit of FIG. 3 transformed to its equivalent circuit. As can be seen in FIG. 14, the linear passive RLC circuit, when transformed, contains only independent voltage sources VL1–VL5, independent current sources IC1–IC5, and resistors R1–R5, regardless of the topology of the circuit.

Figure 15:
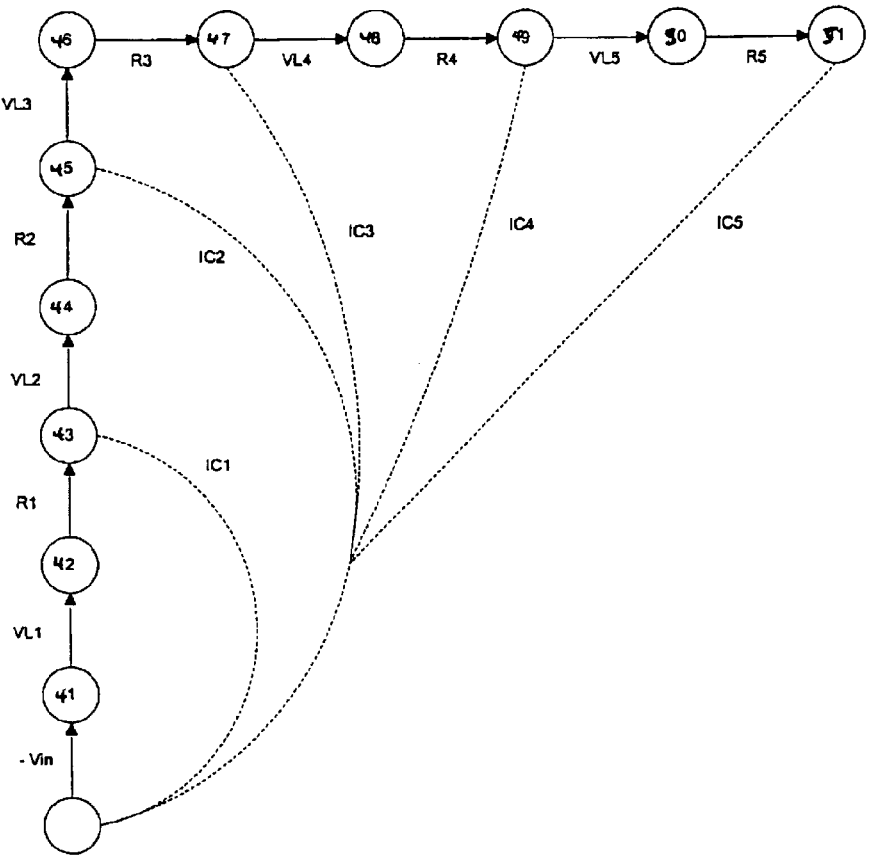
FIG. 15 is a directed graph and spanning tree for the circuit of FIG. 3.

In Block 126, the equivalent DC circuit is then converted into a directed graph. A spanning tree is constructed from the directed graph in Block 128. FIG. 15 is a directed graph and spanning tree for the circuit of FIG. 3. As is known by those skilled in the art, a directed graph contains all the nodes and arcs or branches connecting each node as defined by the DC equivalent circuit, whereas a spanning tree is a connected graph wherein each node is connected to each other node by exactly one unique path and no loops of branches are present.

After the directed graph and spanning tree are constructed, the spanning tree is traversed, Block 130. Techniques for generating a directed graph and spanning tree are disclosed in the article [5] cited above. Then, a set of circuit moments are generated, Block 132. In Block 134, the moments are then mapped to dominant time constants using the MMM moment mapping algorithm. If the desired order of approximation is obtained, as determined by decision Block 136, a simulation is produced in Block 138. It decision Block 136 determines that the desired order of approximation has not been obtained, the flow is returned by loop 137 to Block 130 and a further traversal (or traversals) is performed to generate an additional set(s) of moments. As will be understood by one skilled in the art, multiple generations of moments can be calculated all at once without regard to the number of approximate poles required, as long as at least q+I moments are generated.

Process steps, such as the process steps that are represented by Blocks 122, 124, 126, 128 and 130, for example, are known in the art and will not be described in detail. For example, a method for simulating a microelectric interconnect circuit including process steps similar to those represented by Blocks 122, 124, 126, 128 and 130, for example, is disclosed in the U.S. Pat. No. 5,379,231 to Pillage et al., the disclosure of which is incorporated herein by reference in its entirety. An important difference between the method disclosed in the Pillage et al. '231 Patent and the present invention is in the way that moments are mapped into dominant poles and zeros (represented by block 80 of the Pillage et al. '231 Patent). The way moment mapping is accomplished using the multi-point moment matching technique according to the present invention is much more efficient and can give the accurate dominant poles using much less moments. Therefore, the loop 137 is traversed fewer times. Moreover, the MMM technique is capable of reaching high orders of approximation than is possible using the dominant pole mapping technique described in the Pillage et al. '231 Patent. Process steps, such as the process steps that are represented by Blocks 132, 134 and 138 are described in detail below.

Moment Generation

Figure 16:
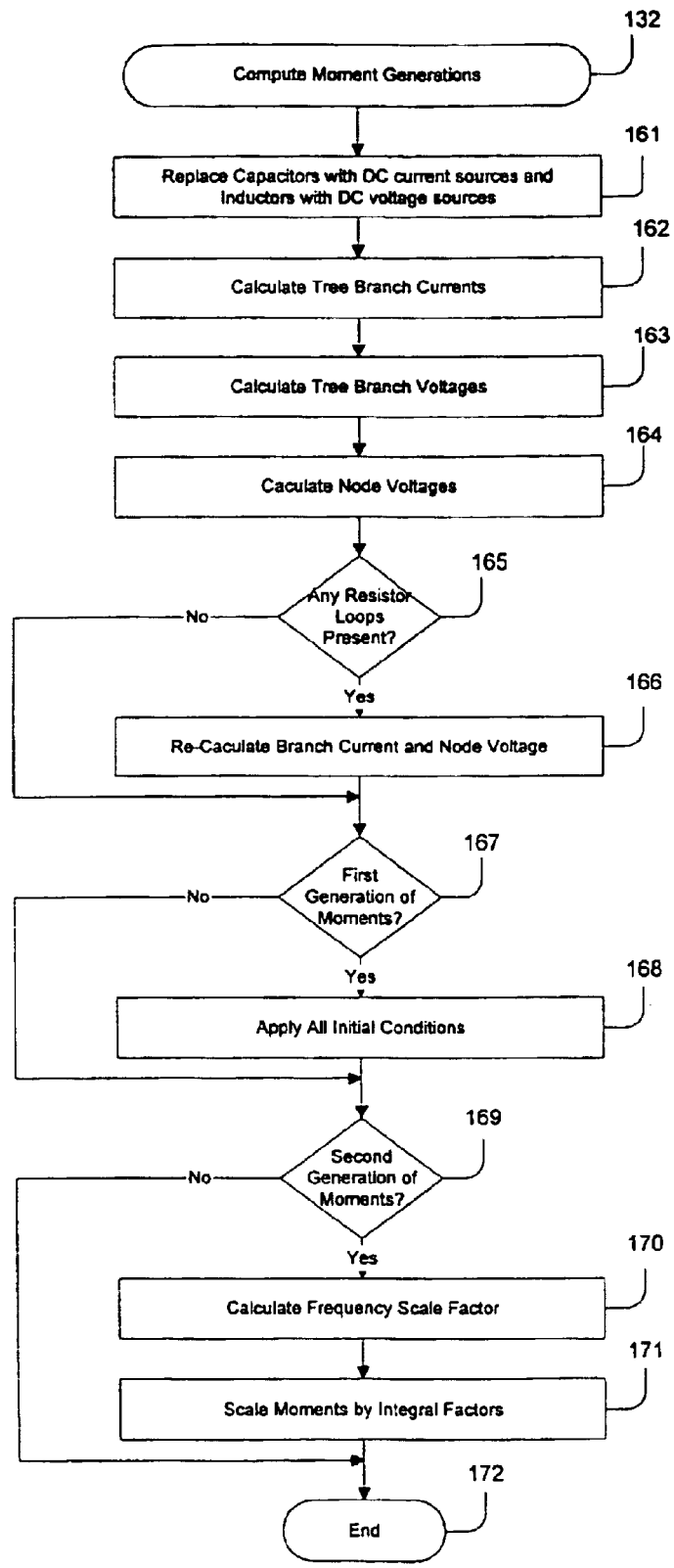
FIG. 16 is a process flow chart for a moment generation step of the process of FIG. 13.

Reference is now made to FIG. 16 which is a process flow chart for the moment generation step 132 of the process of FIG. 13. After the circuit graph and spanning tree are constructed (Blocks 126 and 128 of FIG. 13), a path tracing procedure or traversal is used to generate a set of circuit moments, Block 130. The circuit graph and spanning tree are used to solve the DC circuit by generating a series of sets of circuit moments. For each new moment generation, it is necessary to find a new DC circuit based upon the previous moment generation.

Then, in Block 161, the capacitors are replaced with DC current sources and the inductors are replaced with DC voltage sources. Block 162 computes all link current sources of the equivalent DC circuit. If there are any link inductors in the circuit, a combination of these link currents is used to solve for the currents of all link inductors. Once all link currents are known, the tree branch currents are easily obtained by traversing the graph. The resulting tree branch currents yield the next set of moments for inductors.

Flow proceeds to Block 163 which calculates all tree branch voltages. If any tree capacitors exist in the circuit, then some combination of tree branch voltages specifies the tree capacitor voltages. The tree branch voltages are used to compute the node voltages by performing another traversal of the tree, Block 164.

Decision Block 165 determines if there are any resistor links present in the circuit. If so, the node voltages computed in Block 164 are only preliminary and are used to solve for the resistor link currents. These resistor link currents are then used to update the preliminary node voltages to their final values, Block 166. Flow then proceeds to decision Block 167. On the other hand, if decision Block 165 determines that the circuit does not include resistor links, flow proceeds directly from Block 165 to decision Block 167.

Decision Block 167 determines if this is the first generation of moments, and if so, the initial conditions (if any) are applied by subtracting them from the respective steady state solution, Block 168. Flow proceeds to a further decision Block 169. After the first generation of moments has been computed, flow proceeds from decision Block 167 to decision Block 169.

Decision Block 169 determines if this is a second generation of moments, and if so, flow proceeds to Block 170 in which a frequency scale factor is computed as the quotient of the first and second generation voltages at a response node designated by the user. Then, all second generation moments are scaled (multiplied) by this factor and all subsequent moment generations (3rd, 4th, etc.) are scaled by an integral power of this factor, Block 171, and the moment generation program is exited at block 172. For the first generation of moments, the moments are not scaled and so decision block 169 directs the flow to Block 172.

Moment Matching

Figure 17:
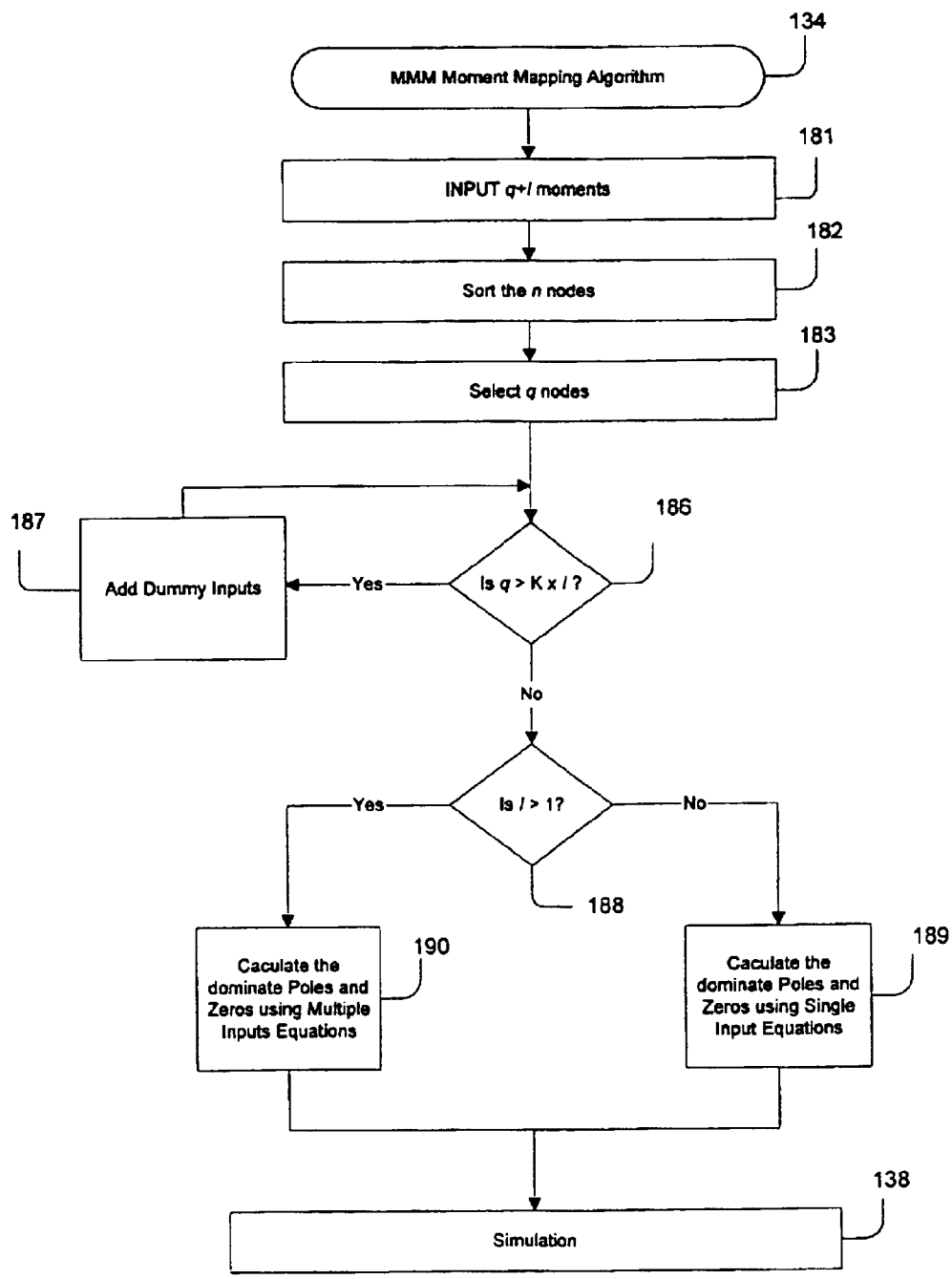
FIG. 17 is a process flow chart for a moment mapping step of the process of FIG. 13.

Reference is now made to FIG. 17, which is a process flow chart for the moment mapping step 134 of the process of FIG. 13. The MMM moment mapping algorithm, Block 134, is a formal method for simultaneously matching q+I moments at q points of the circuit being simulated, which in the example, is a simple, single input RLC circuit (FIG. 3). Determining a reduced order system of approximation order q using the MMM technique requires q+I moments at q nodes, or q=3 and I=1. Thus, at each of the nodes of the circuit in FIG. 3, a set of four moments is calculated. Hence, at node 43 for example, there are four moments given by $m_0^{43}$ $m_1^{43}$, $M_2^{43}$, and $M_3^{43}$. The same is valid for all other state variables 42, 44–51. Note that the even numbers are taken as pointing to the inductors, rather than to the nodes between the inductors and resistances. Hence for each capacitor and inductor in the circuit there is a different set of four moments. The set of first moments at all the nodes are given by $m_1^{43}$, $m_1^{44}$, ... $m_1^{51}$ .... Block 181 inputs q+I moments at n nodes. Because the exemplary circuit is a single input circuit, I is equal to 1. Also, to avoid loss of accuracy, the state variables at the nodes are sorted in terms of the first moment at Block 182 to select q out of n nodes. Preferably, this set of moments is sorted in ascending order. Flow proceeds to Block 183 which selects q nodes to represent the circuit. Then, the nodes corresponding to the moments are selected at equidistant steps. The nodes corresponding to far away moments are selected at equidistant steps starting with the variable with the smallest moment and ending with the variable with the largest moment. The variables are selected with moments as far as possible. The RLC circuit in FIG. 3 is simple and the moments increase as the node numbers. Hence a good choice for a third order approximation is state variables 42 (L1), 45(C25), 48 (L4), and 51 (C28).

Flow then proceeds to decision Block 186.

Decision Block 186 determines if q is greater than the number of inputs I, multiplied by a constant K. If so, dummy inputs are added, Block 187, to increase the increase the stability of the approximation. In one embodiment, the value of the constant K is six. The value six is chosen because six is a safe number where it is difficult for an approximation to numerically break. However, values greater than six or less than six can be used. If a value smaller than six is used to increase the stability of the approximation, more dummy inputs must be added to satisfy the relationship (K*I>q), i.e., the value of the constant K multiplied by the number of inputs I must be greater than q.

The dummy inputs introduced by Block 187 reduce the truncation errors in high order approximations. Dummy inputs are selected that are physically far from each other. Dummy inputs are added until the maximum power of the poles in the MMM approximation are sufficiently low to guarantee the numerical stability of the approximation.

In the example, in which q=3 and the circuit (FIG. 3) has only one input, and so Block 186 determines that the product of K*1 is greater than three and no dummy inputs have to be added. However, assuming that a higher order approximation were being calculated, q>6, then a dummy input (or inputs) would have to be added until the condition of Block 186 is met.

When the condition of Block 186 (K*I>q)is met, flow proceeds to decision Block 188 which determines if the circuit is a single input circuit or a multiple input circuit. If the circuit is a single input circuit, I=1, as is the case in the example, flow proceeds to Block 189 which calculates the dominant poles and zeros using equations [9]–[12]. For the case where the circuit to be simulated is a multiple input circuit, or where dummy inputs had to be added to meet the relationship of Block 186, flow proceeds to Block 190 which calculates the dominant poles and zeros using equations [20]–[22]. Finally, a time domain simulation is produced in Block 138.

As discussed above, the use of multi-point moment matching in accordance with the invention maps the moments into dominant poles and zeros in a more efficient manner than is possible using a single point moment matching technique. Further, use of MMM allows calculating the dominant poles using fewer moments than does single point moment matching. Consequently, the loop 137, shown in FIG. 13, is traversed fewer times.

Simulation

Figure 18:
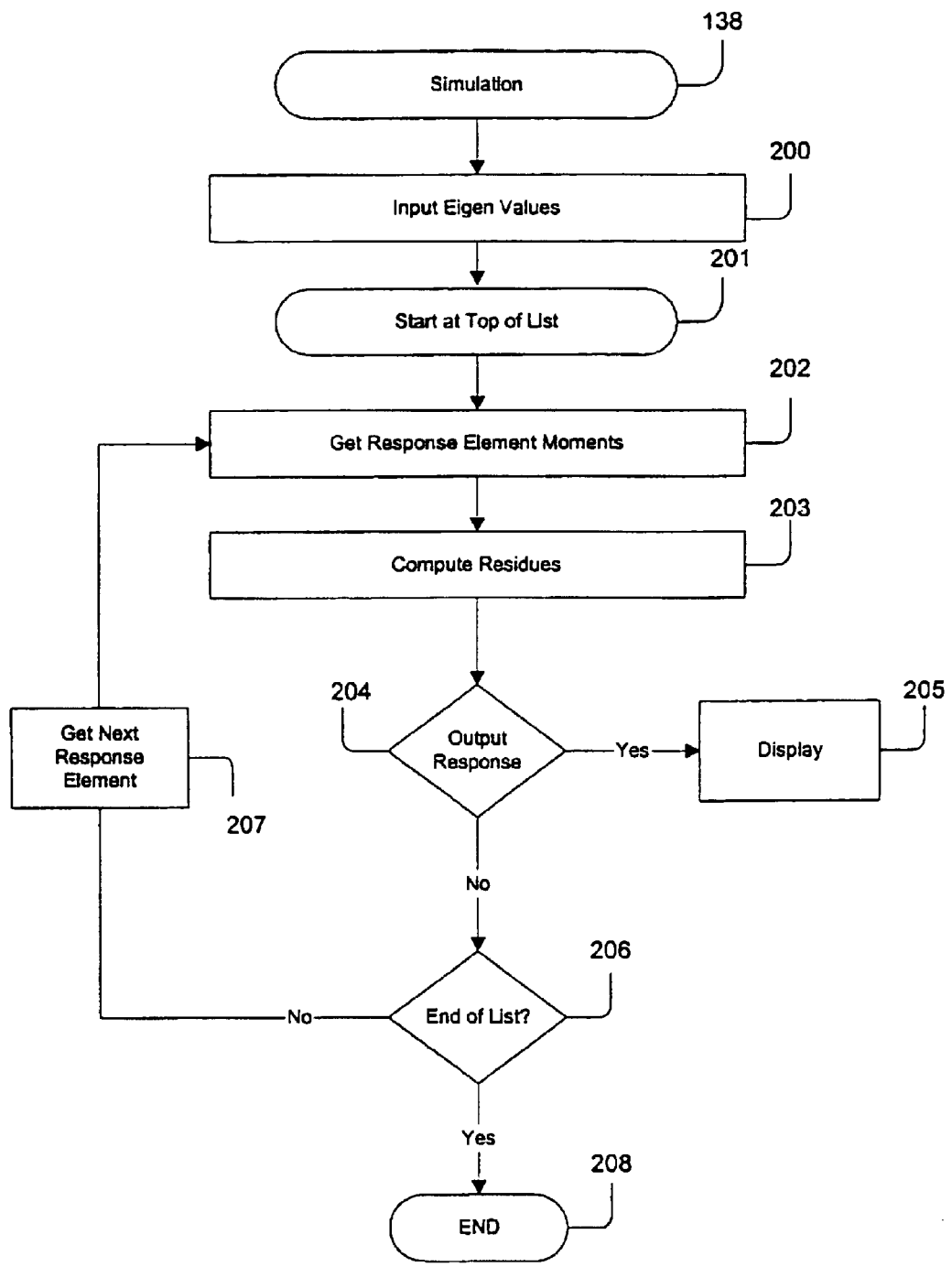
FIG. 18 is a process flow chart for a simulation producing step of the process of FIG. 13.

Reference is now made to FIG. 18 which is a process flow chart for the simulation step 138 of the process of FIG. 13. In producing the simulations, MMM uses the state space representation of the system rather than the transfer function as is done in the method disclosed in the Pillage et al. '213 Patent. The eigen values $p_1$ $p_2$ ... $p_q$, of the system matrix A in the state space representation are the common set of poles of the system. Block 200 inputs the dominant poles $p_1$ $p_2$ ... $p_q$ and the list of the response nodes previously selected.

Then, starting with the first selected node, Block 202, the residues for each pole are calculated using the moments of the selected nodes, Block 203. Decision Block 204 determines if the response should be displayed. The simulated the time domain response can be produced by a step function excitation, or a ramp excitation, if desired, with a desired rise time entered by a user. The time domain response is displayed at Block 205. Otherwise, flow proceeds to Block 206 which determines if all response nodes have been selected. The process is repeated for each desired node response, Blocks 206 and 207, and completed when the waveforms for the full set of desired nodes have been displayed.

Nonlinear Simulator

Figure 19:
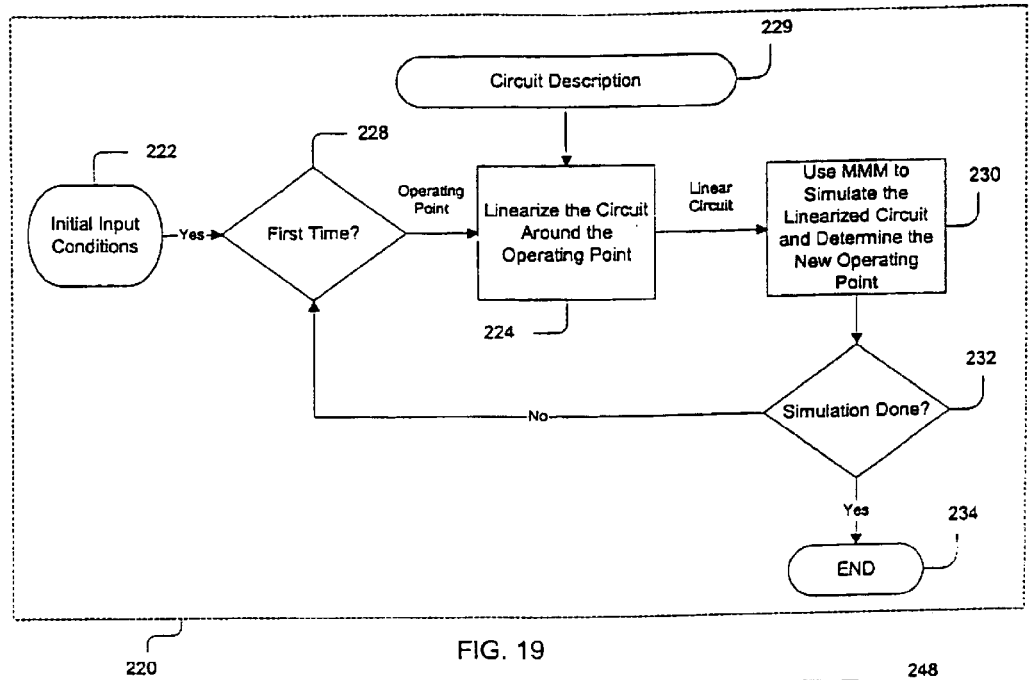
FIG. 19 is a block diagram illustrating the use of the multi-point moment matching technique as a nonlinear simulator.

Referring to FIG. 19, another application for the MMM technique is as a nonlinear circuit simulator 220. Nonlinear circuits are circuits which include a mix of linear and nonlinear elements which gives rise to nonlinear differential equations. For example, transistors in VLSI circuits are nonlinear elements. Nonlinear circuits can be simulated by using a piecewise linear circuit model. The circuit is linearized several times and the resulting linear circuits are simulated. The simulations that are obtained are combined over time to represent the response of the nonlinear circuit. Hence, an efficient linear simulator is at the heart of any nonlinear circuit simulator.

FIG. 19 is a process flowchart for the nonlinear circuit simulator 220 employing the MMM technique. The process begins at Block 222 which inputs initial conditions. Decision Block 228 determines if this is the first time through the loop and if so, Block 224 receives the circuit description, Block 229, of the circuit to be simulated. The circuit description can be provided by an interconnect simulator, for example.

Block 224 linearizes the circuit around an operating point and provides the linearized circuit to Block 230 which corresponds to the simulator system 12 described above with reference to FIGS. 13–19 in an application as an interconnect evaluator. Block 230 simulates the linearized circuit using the MMM technique and determines a new operating point. Flow proceeds to decision Block 232 which determines whether the simulation is done. If so, the process is ended at Block 234. If not, flow returns to Block 228 which applies the new operating point to Block 224 to produce a second Ire version of the linearized circuit.

Simulation Engine

Figure 20:
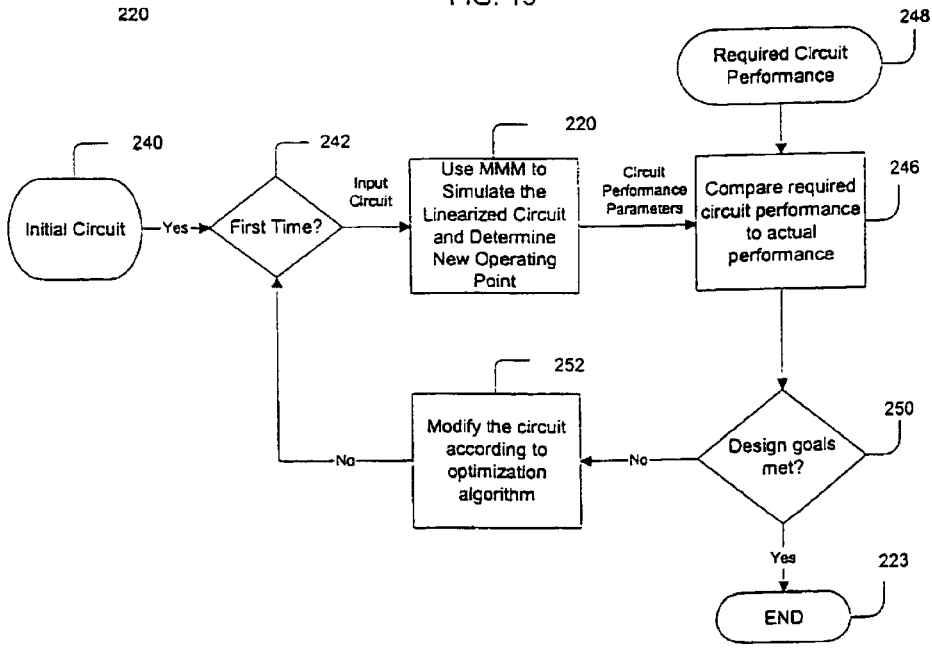
FIG. 20 is block diagram illustrating the use of the multi-point moment matching technique as a simulation engine for iterative design optimization.

Referring to FIG. 20, a further application for the MMM technique, is as a simulation engine. At the core of any design optimization tool is an efficient simulation engine. Typically, an optimization tool uses a simulation engine to evaluate the performance of the circuit in terms of key design parameters such as speed, power consumption, and signal integrity. If the circuit performance does not meet the design goals, the circuit is modified based on some circuit optimization algorithm and the performance is evaluated again. This iterative process is repeated until the circuit meets the design goals or reaches the optimum performance. The efficiency of the underlying simulation engine is crucial for such design optimization algorithms since numerous simulations are required in one optimization run. Note that the simulation time represents the bottleneck in such optimization algorithms. Numerous CAD tools can use MMM as a simulation engine such as transistor and wire sizing tools, clock distribution network design tools, power distribution network design tools, power optimization tools, noise reduction tools, and virtually any design tool in an IC CAD tool set.

Referring to FIG. 20, there is shown a process flowchart for a simulation engine incorporating the nonlinear circuit simulator 220 of FIG. 19 which uses the MMM technique, for iterative design optimization CAD tools. The process begins at Block 240 which receives the initial circuit description. Decision Block 242 determines if this is the first time through the loop, and if so, Block 220, which represents the nonlinear circuit simulator 220, (FIG. 19) linearizes the circuit and simulates the linearized circuit using the MMM techniques, to determine a new operating point. The results of the simulation are provided to Block 246 Block 246 compares the required circuit performance from Block 248, with the actual performance of the circuit as determined by the simulation provided by the nonlinear circuit simulator 220 (FIG. 19).

Then, decision Block 250 determines if the design goals are met. If Block 250 determines that the design goals are met, the design optimization is ended at Block 223. However, if Block 250 determines that the design goals are not met, flow proceeds to Block 252 which modifies the circuit according to an optimization algorithm. Many optimization algorithms are known in the art. Examples of optimization algorithms which can be used to modify the circuit to meet design goals are described in:

[15] J. Cong, A. B Kahng, C.-K. Koh and C.-W. A. Tsao, "Bounded-Skew Clock and Steiner Routing Under Elmore Delay," *Proceedings of the IEEE International Conference On Computer-Aided Design*, pp. 66–71, January 1995.

[16] G. Y. Yacoub, H. Pham, M. Ma, and E. G. Friedman, "A System for Critical Path Analysis Based on Back Annotation and Distributed Interconnect Impedance Models," *Microelectronic Journal*, Vol. 18, No. 3, pp. 21–30, June 1988.

[17] K. D. Boese, A. B. Kahng, B. A. McCoy, and G. Robins, "Rectilinear Steiner Trees with Minimum Elmore Delay," *Proceedings of the IEEE/ACM Design Automation Conference*, pp. 381–386, June 1994.

[18] S. S. Sapatnekar, "RC Interconnect Optimization Under the Elmore Delay Model," *Proceedings of the IEEE/ACM Design Automation Conference*, pp. 387–391, June 1994.

[19] J. Cong and L. He, "Optimal Wire Sizing for Interconnects with Multiple Sources," *Proceedings of the IEEE International Conference on Computer-Aided Design*, pp. 586–574, November 1995

The flow returns to decision Block 242 which causes Block 220 to provide a further simulation of the circuit as modified. Block 220 linearizes the modified circuit and produces the further simulation the results of which are provided to Block 246 for comparison with the required circuit performance. The process continue to loop in this manner until the circuit meets the design goals performance simulation is done as determined by decision Block 250.

Figure 21:
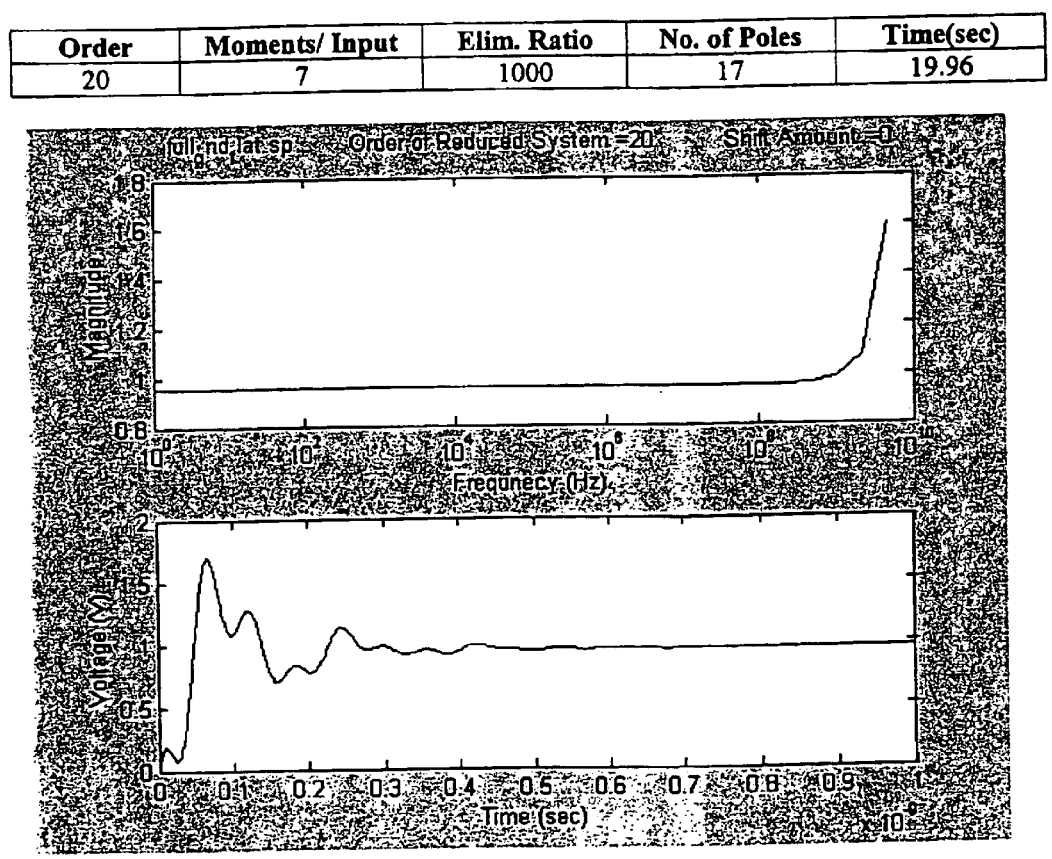
FIGS. 21 and 22 show the results of simulation tests for a circuit using the multi-point moment matching technique in accordance with the present invention.
Figure 22:
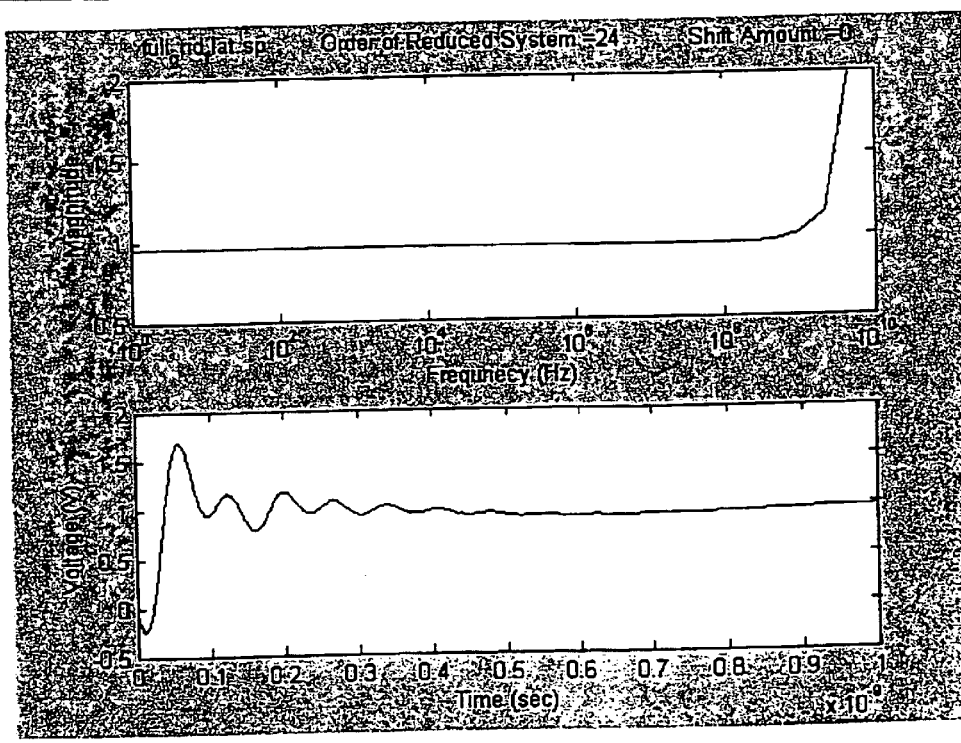

Referring to FIGS. 21 and 22, there is shown the results of simulation tests for a circuit using the multi-point moment matching technique in accordance with the present invention. The circuit simulated is a commercial grid clock distribution system which included more than 80 thousand elements. An attempt to run the simulation using SPICE was made, and SPICE couldn't finish the whole circuit. One quarter of this circuit took six days on SPICE. The simulation was run on a P4 1.6 GHz Intel Processor with 256M RAM. The inventor ran a simulation program which was based upon the multi-point moment matching technique of the present invention, and the simulation took approximately 10–25 seconds to complete, depending upon the selected approximation order.

The inventor ran a simulation program which was based upon the multi-point moment matching technique of the present invention, using several different reduction orders and found very good consistency among all these orders. FIGS. 21 and 22 show outputs of the circuit being simulated for 20th order and 24th order approximations, respectively. For the results shown in FIGS. 21 and 22, the circuits had 7 moments per input and 5 moments per input, respectively.

As can be seen from FIGS. 21 and 22, higher orders provide good approximations and show fine details, such as for the portion of the waveform from about zero to about 0.4 nano second range. Lower order approximations which were simulated provided good approximations, but did not show some of the details. By going to higher orders, the fine details can be captured at higher execution time. Moreover, the accuracy and speed of the program can be improved through selection of the program language used, such as by using an optimized C language program.

APPENDIX I

Relation Between the Residues and the Eigen Vectors of the System Matrix

Consider a single input linear system with a dimension q of the form $$\dot{x}=Ax+bu. \qquad (34)$$

By taking the Laplace transform of equation (34) for a unit impulse input, x(s) can be expressed as $$x(s)=(sI-A)^{-1}b. \qquad (35)$$

This expression can be expanded into powers of s as $$x(s)=-[A^{-1}+A^{-2}s+A^{-3}s^2+\ldots]b. \qquad (36)$$

Hence, the moment vectors of x(s) are given by $$m_i=-A^{-(i+1)}b. \qquad (37)$$

The vector b can be expressed as a linear combination of the eigen vectors of A as given by $$b=\alpha_1 v_1+\alpha_2 v_2+\ldots+\alpha_q v_q, \qquad (38)$$

where the constants $\alpha_1-\alpha q$ (expressed in vector notation as $\alpha$) can be determined from $$\alpha=T^{-1}b, \qquad (39)$$

with $$T=[v_1 v_2 \ldots v_q]. \qquad (40)$$

Substituting equation (38) into equation (37) and using the well known relation $f(A)v_i=f(p^i)v_i$ where $p_i$ is the eigen value of A corresponding to $v_i$ and $f(A)$ is any matrix function of A, the following relation results $$m_i = \left[ \frac{\alpha_1}{p_1^{i+1}} v_1 + \frac{\alpha_2}{p_2^{i+1}} v_2 + \ldots + \frac{\alpha_p}{p_q^{i+1}} v_q \right], \qquad (41)$$

However, the relation between the moments and the residues in equation (3) can be expressed in vector form as $$m_i = -\left[ \frac{1}{p_1^{i+1}} k_1 + \frac{1}{p_2^{i+1}} k_2 + \ldots + \frac{1}{p_q^{i+1}} kq \right], \qquad (42)$$

where $k_i$ is the vector containing the residues corresponding to the pole pi at all the state variables in equation (34). By comparing equations (27) and (26), the residue vectors are just the scaled eigen vectors given by $$k_i = \alpha_{r(j)} v_i. \quad (43)$$

While the significance of this relation is not so obvious for single output systems, this relation has significant consequences for multiple input systems. Consider a linear system with I inputs of the form $$x = Ax + b_1 u_1 + b_2 u_2 + \ldots b_1 u_1. \quad (44)$$

The same process used for a single input system can be used on each input with all other inputs equal to zero, resulting in the following relations $$k_{1,k} = \alpha_{1,k} v_1, \quad (45)$$
$$k_{2,k} = \alpha_{2,k} v_2,$$
$$\vdots$$
$$k_{q,k} = \alpha_{q,k} v_q,$$

for k=1 ... I where $k_{i,k}$ is a vector including the residues of the $i^{th}$ pole $p_i$ due to a unit impulse at $u_k$ and $\alpha_{1,k}-\alpha_{q,k}$ are a set of q constants unique to each input which can be determined from $$\alpha_k = T^{-1} b_k. \quad (46)$$

Hence, the residue vectors corresponding to a certain pole $p_i$ due to different inputs are not completely independent but are actually just scaled versions of the same vector $v_i$. This fact reduces the number of unknowns in the residue vectors from $q^2 I$ to $q^2 + qI$ which is a potentially much smaller number for large q and I. Finally, note that this relation holds for any linear system including the linear system representing the whole circuit of order n. Hence, by nature, the model order reduction technique used by MMM preserves this characteristic of the original circuit. Note also that a reduced order model determined based on MMM has a common set of poles at all the nodes represented by the eigen values of A and hence, MMM also preserves this characteristic of the original circuit.

What is claimed is:

1. A method for simulating at least linear circuits and systems using a reduced order model, the circuit or system having n state variables at n nodes, said method comprising the steps of:

transforming a circuit description of the interconnect circuit into an equivalent DC circuit;

converting the equivalent DC circuit into a directed graph;

constructing a spanning tree from the directed graph;

and, after the directed graph and spanning tree have been constructed, traversing the spanning tree to generate a set of q+I circuit moments at q nodes of the circuit or system, where q is the approximation order and I is the number of inputs of the circuit or system;

mapping the circuit moments to dominant time constants using a multi-point moment matching algorithm to simultaneously match the q+I moments at q nodes of the circuit or system; and using the reduced order system to calculate a simulation.

2. The method according to claim 1, and including using parallel processing to generate the moments.

3. The method according to claim 1, and including determining whether a desired order of approximation has been obtained.

4. The method according to claim 3, and including performing at least one further traversal of the spanning tree to generate an additional set of circuit moments until the desired order of approximation has been obtained.

5. The method according to claim 1, wherein mapping the circuit moments includes sorting the state variables at the nodes in terms of a first moment.

6. The method according to claim 5, wherein mapping the circuit moments further includes selecting nodes corresponding to moments at equidistant steps, starting with the variable with the smallest moment and ending with the variable with the largest moment.

7. The method according to claim 6, including calculating a set of moments at each of the selected nodes of the circuit or system.

8. The method according to claim 1, wherein mapping the circuit moments includes calculating the dominant poles and zeros using a multi-point moment matching algorithm to simultaneously match q+I moments at q points of the circuit or system.

9. The method according to claim 1, including using at least one extra dummy input.

10. The method according to claim 9, including setting the dummy input to zero after the reduced order system has been determined.

11. The method according to claim 1, including using extra dummy inputs such that the total number of inputs equals I, such that K*I>q, where K is a constant having a value in the range of about 4 to 8.

12. The method according to claim 11, wherein K has a value of 6.

* * * * *